(12) United States Patent
Hatano et al.

(10) Patent No.: US 9,337,244 B2
(45) Date of Patent: May 10, 2016

(54) LIGHT-EMITTING DEVICE AND ELECTRONIC DEVICE USING LIGHT-EMITTING DEVICE

(75) Inventors: Kaoru Hatano, Kanagawa (JP); Satoshi Seo, Kanagawa (JP); Akihiro Chida, Kanagawa (JP); Yoshiaki Oikawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 207 days.

(21) Appl. No.: 13/404,692

(22) Filed: Feb. 24, 2012

(65) Prior Publication Data

US 2012/0217516 A1 Aug. 30, 2012

(30) Foreign Application Priority Data

Feb. 25, 2011 (JP) ................. 2011-039621

(51) Int. Cl.
*H01L 33/08* (2010.01)
*H01L 27/32* (2006.01)
*H01L 51/52* (2006.01)

(52) U.S. Cl.
CPC .......... *H01L 27/3246* (2013.01); *H01L 51/525* (2013.01)

(58) Field of Classification Search
USPC .................... 257/88; 313/506, 498
See application file for complete search history.

(56) References Cited

U.S. PATENT DOCUMENTS

| | | | |
|---|---|---|---|
| 6,127,199 A | 10/2000 | Inoue et al. | |
| 6,348,359 B1 * | 2/2002 | Van Slyke | H01L 27/3281 313/504 |
| 6,372,608 B1 | 4/2002 | Shimoda et al. | |
| 6,429,584 B2 | 8/2002 | Kubota | |
| 6,626,721 B1 * | 9/2003 | Van Slyke | H01L 27/3283 313/504 |
| 6,645,830 B2 | 11/2003 | Shimoda et al. | |
| 6,818,530 B2 | 11/2004 | Shimoda et al. | |
| 6,828,727 B2 | 12/2004 | Yamazaki | |

(Continued)

FOREIGN PATENT DOCUMENTS

| | | |
|---|---|---|
| CN | 1825616 A | 8/2006 |
| CN | 101728420 A | 6/2010 |

(Continued)

OTHER PUBLICATIONS

International Search Report re application No. PCT/JP2012/053904, dated May 15, 2012.

(Continued)

*Primary Examiner* — Zandra Smith
*Assistant Examiner* — Lawrence Tynes, Jr.
(74) *Attorney, Agent, or Firm* — Husch Blackwell LLP

(57) ABSTRACT

Provided is a highly reliable light-emitting device in which a light-emitting element is prevented from being damaged when external physical force is applied. The light-emitting device includes a light-emitting element formed over a first substrate, including a first electrode layer, a light-emitting layer, and a second electrode layer; a structure body formed over the first substrate; a second substrate provided to face the first substrate; and a bonding layer provided between the first substrate and the second substrate. The light-emitting layer is separated by the structure body. By strengthening adhesion between the structure body and the bonding layer, or between the structure body and the second electrode, the highly reliable light-emitting device in which damage of the light-emitting element is prevented can be provided.

25 Claims, 11 Drawing Sheets

(56) References Cited

U.S. PATENT DOCUMENTS

| | | |
|---|---|---|
| 7,633,223 B2 | 12/2009 | Yamazaki |
| 7,753,751 B2 | 7/2010 | Yamazaki |
| 7,834,543 B2 | 11/2010 | Takata |
| 7,969,086 B2 | 6/2011 | Kim |
| 8,760,046 B2 | 6/2014 | Seo et al. |
| 9,006,965 B2 | 4/2015 | Seo et al. |
| 2001/0054867 A1 | 12/2001 | Kubota |
| 2002/0101154 A1* | 8/2002 | Seo et al. .............. 313/506 |
| 2002/0125817 A1* | 9/2002 | Yamazaki et al. ...... 313/498 |
| 2003/0032210 A1 | 2/2003 | Takayama et al. |
| 2008/0018229 A1 | 1/2008 | Yamazaki |
| 2008/0030128 A1 | 2/2008 | Kim |
| 2009/0239320 A1 | 9/2009 | Takayama et al. |
| 2010/0006845 A1 | 1/2010 | Seo et al. |
| 2010/0096633 A1* | 4/2010 | Hatano ............ H01L 27/1214 257/59 |
| 2010/0105275 A1 | 4/2010 | Kubota |
| 2010/0176720 A1 | 7/2010 | Yamazaki et al. |
| 2011/0163311 A1* | 7/2011 | Akimoto .......... H01L 27/1225 257/43 |
| 2015/0214251 A1 | 7/2015 | Seo et al. |

FOREIGN PATENT DOCUMENTS

| | | |
|---|---|---|
| EP | 2 178 133 A2 | 4/2010 |
| JP | 10-125931 | 5/1998 |
| JP | 2001-284041 | 10/2001 |
| JP | 2003-174153 | 6/2003 |
| JP | 2006-126817 | 5/2006 |
| JP | 2007-95611 | 4/2007 |
| JP | 2007-329448 A | 12/2007 |
| JP | 2008-112656 | 5/2008 |
| JP | 2010-040520 A | 2/2010 |
| JP | 2011-3522 | 1/2011 |
| JP | 4664604 B2 | 4/2011 |
| JP | 2014-041836 A | 3/2014 |
| JP | 2015-159125 A | 9/2015 |
| KR | 10-2006-0051830 | 5/2006 |
| KR | 2007-0117118 A | 12/2007 |
| KR | 10-2010-0042602 | 4/2010 |
| KR | 2011-0039314 A | 4/2011 |
| KR | 10-2011-0084857 | 7/2011 |
| KR | 2014-0084359 A | 7/2014 |
| KR | 2015-0055099 A | 5/2015 |
| TW | 201018307 | 5/2010 |
| WO | WO 2008/107956 A1 | 9/2008 |
| WO | WO 2010/004944 A1 | 1/2010 |

OTHER PUBLICATIONS

Written Opinion re application No. PCT/JP2012/053904, dated May 15, 2012.

* cited by examiner 190  161  162

164

190  161  162  164  166  168

LIGHT-EMITTING DEVICE AND ELECTRONIC DEVICE USING LIGHT-EMITTING DEVICE

TECHNICAL FIELD

One embodiment of the present invention relates to a light-emitting device utilizing electroluminescence. Further, an embodiment of the present invention relates to an electronic device using the light-emitting device.

BACKGROUND ART

In recent years, research and development have been extensively conducted on light-emitting elements using electroluminescence (EL). In a basic structure of such a light-emitting element, a layer containing a light-emitting substance is provided between a pair of electrodes. By applying voltage to this element, light emission can be obtained from the light-emitting substance.

Since the above light-emitting element is a self-luminous type, a light-emitting device using this light-emitting element has advantages such as high visibility, no necessity of a backlight, low power consumption, and the like. Further, such a light-emitting element also has advantages in that the element can be formed to be thin and lightweight and that response time is high.

The light-emitting device having the light-emitting element can have flexibility and impact resistance in addition to its thinness and lightness and thus has been expected to be applied to a flexible substrate. The light-emitting element is applied not only to the light-emitting device but also to a semiconductor device or the like which functions by utilizing semiconductor characteristics.

As a method for manufacturing semiconductor device using a flexible substrate, a technique in which after a semiconductor element such as a thin film transistor is formed over a base material such as a glass substrate or a quartz substrate, the semiconductor element is transposed from the base material to another base material (for example, a flexible base material) has developed. In order to transpose the semiconductor element to another base material, a step for separating the semiconductor element from the base material that is used for forming the semiconductor element is necessary.

For example, Patent Document 1 discloses a separation technique using laser ablation, which is described below. A separation layer formed of amorphous silicon or the like is formed over a substrate, a layer to be separated which is formed of a thin film element is formed over the separation layer, and the layer to be separated is bonded to an object to which the layer to be separated is transposed by a bonding layer. The separation layer is ablated by laser light irradiation, so that separation of the separation layer is generated.

In addition, Patent Document 2 discloses a technique in which separation is conducted by physical force such as human hands. In Patent Document 2, a metal layer is formed between a substrate and an oxide layer and separation is generated at an interface between the oxide layer and the metal layer by utilizing weak bonding between the oxide layer and the metal layer at the interface, so that a layer to be separated and the substrate are separated from each other.

In Patent Document 2, an interlayer insulating film is formed over the light-emitting element including an anode, an organic light-emitting layer, and a cathode, and the interlayer insulating film is bonded to a supporting member using a bonding layer. Then, separation is performed at the interface between the oxide layer and the metal layer, and the layer to be separated including the light-emitting element is bonded to a film substrate using the bonding layer, so that a light-emitting device using a flexible substrate is manufactured.

REFERENCE

Patent Documents

[Patent Document 1] Japanese Published Patent Application No. H10-125931
[Patent Document 2] Japanese Published Patent Application No. 2003-174153

DISCLOSURE OF INVENTION

Here, the light-emitting element formed in the layer to be separated has a structure in which a light-emitting layer is provided between a pair of electrodes. In the case where an organic compound is used for the light-emitting layer, adhesion between the light-emitting layer and an electrode which is a cathode or an anode formed in contact with the light-emitting layer is low. In the case where the adhesion between the light-emitting layer and the electrode is low, the separation may occur at the interface between the light-emitting layer and the electrode when the separation layer is separated from the layer to be separated by physical force.

In addition, in the case of a light-emitting device using a flexible substrate, there is a possibility that separation may occur at the interface between the light-emitting layer and the electrode, and the light-emitting element may be damaged when physical force such as bending or curving is externally applied.

In view of the above problems, an object of one embodiment of the disclosed invention in this specification and the like is to provide a highly reliable light-emitting device in which a light-emitting element is prevented from being damaged when external physical force is applied.

One embodiment of the present invention is a light-emitting device which includes a light-emitting element formed over a first substrate, including a first electrode layer, a light-emitting layer, and a second electrode layer; a structure body formed over the first substrate; a second substrate provided to face the first substrate; and a bonding layer provided between the first substrate and the second substrate. The light-emitting layer is separated by the structure body. By strengthening adhesion between the structure body and the bonding layer or between the structure body and the second electrode, a highly reliable light-emitting device in which the light-emitting element is prevented from being damaged can be provided. Detail thereof is described below.

One embodiment of the present invention is a light-emitting device which includes a light-emitting element formed over a first substrate, including a first electrode layer, a light-emitting layer formed in contact with the first electrode layer, and a second electrode layer formed in contact with the light-emitting layer; a structure body formed over the first substrate; a second substrate provided to face the first substrate; and a bonding layer provided between the first substrate and the second substrate. The light-emitting layer is separated by the structure body, and at least a part of the structure body is in contact with the bonding layer.

One embodiment of the present invention is a light-emitting device which includes a light-emitting element formed over a first substrate, including a first electrode layer, a light-emitting layer formed in contact with the first electrode layer, and a second electrode layer formed in contact with the light-emitting layer; a structure body formed over the first substrate; a second substrate provided to face the first substrate; and a bonding layer provided between the first substrate and the second substrate. The light-emitting layer is separated by the structure body, and at least a part of the structure body is in contact with the second electrode layer.

In each of the above described structures, the first substrate and the second substrate may have flexibility. Further, in each of the above described structures, the first electrode may be connected to a transistor. Furthermore, in each of the above described structures, the second substrate may have a colored layer which transmits light of a specific wavelength band.

Further, in each of the above described structures, the light-emitting layer may include a hole injection layer, a hole transport layer, an electron transport layer, and an electron injection layer. Moreover, in each of the above described structure, white light emission may be obtained from the light-emitting element, and light emission from the light-emitting element may be extracted through the second substrate.

One embodiment of the present invention is an electronic device including the light-emitting device having any of the above structures.

Note that in this specification and the like, the light-emitting device includes an image display device, a light-emitting device, a light source, a lighting device, and the like. Further, the light-emitting device includes a module in which a connector (e.g., FPC: flexible printed circuit) or the like is attached to a panel where a light-emitting element is formed.

In this specification and the like, a light-emitting element has a light-emitting layer between a pair of electrodes. Besides the light-emitting layer, a functional layer or the like may be provided between the pair of electrodes.

In this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be used to denote the drain and the source, respectively, in this specification.

A highly reliable light-emitting device is provided in which a light-emitting element is prevented from being damaged when external physical force is applied to the light-emitting device provided with the light-emitting element including a light-emitting layer provided between a pair of electrodes.

BEST MODE FOR CARRYING OUT THE INVENTION

Figure 1A:
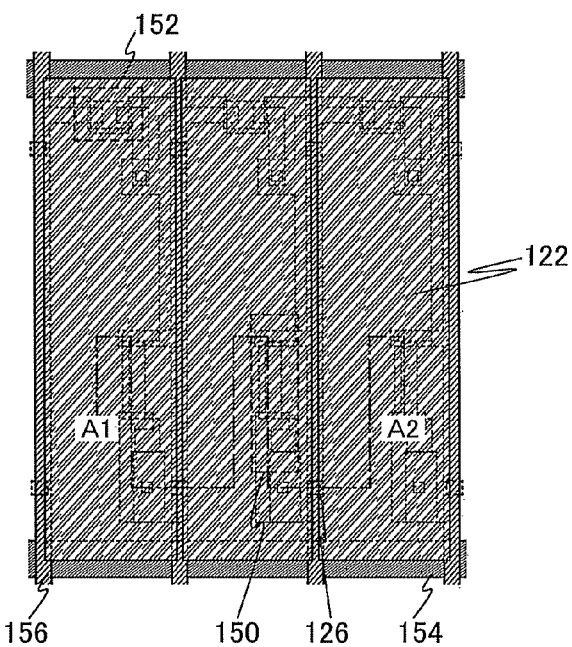
FIGS. 1A and 1B are a top view and a cross-sectional view of a light-emitting device.

Hereinafter, Embodiments are described in detail using the drawings. Note that the present invention is not limited to the embodiments described below, and it is apparent to those skilled in the art that modes and details can be modified in various ways without departing from the spirit of the present invention disclosed in this specification and the like. A structure of the different embodiment can be implemented by combination appropriately. On the description of the invention with reference to the drawings, a reference numeral indicating the same part is used in common throughout different drawings, and the repeated description is omitted.

Note that the position, the size, the range, or the like of each structure illustrated in the drawings and the like is not accurately represented in some cases for easy understanding. Therefore, the present invention is not necessarily limited to the position, size, range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, according to one embodiment of a light-emitting device of the present invention, a structure of the light-emitting device is described with reference to FIGS. 1A and 1B, and then a method for manufacturing the light-emitting device is described with reference to FIGS. 2A to 2D, FIGS. 3A to 3C, FIGS. 4A and 4B, and FIGS. 5A and 5B.

⟨Structure of Light-Emitting Device⟩

FIG. 1A is a top view of a first substrate 100 seen from a second electrode layer 122 side, which illustrates a part of a pixel of the light-emitting device. FIG. 1B is a cross-sectional view taken along broken line A1-A2 in FIG. 1A. In the top view of FIG. 1A, some components (e.g., a partition wall 124, and the like) of the present invention are omitted in order to avoid complex views.

In the light-emitting device shown in FIG. 1A, a plurality of source wirings 156 is provided parallel to (extending in the vertical direction in the drawing) and apart from each other, and a plurality of gate wirings 154 is provided parallel to (extending in the horizontal direction in the drawing) and apart from each other. A substantially rectangular region is surrounded by the source wirings 156 and the gate wirings 154. This region serves as one pixel of the light-emitting device, and a plurality of pixels is arranged in matrix.

Further, a transistor 150 which controls driving of a light-emitting element and a transistor 152 which selects an intended pixel are formed in each pixel. That is, the light-emitting device shown in FIGS. 1A and 1B is, an active matrix light-emitting device. A plurality of structure bodies 126 is provided between the pixels.

Figure 1B:
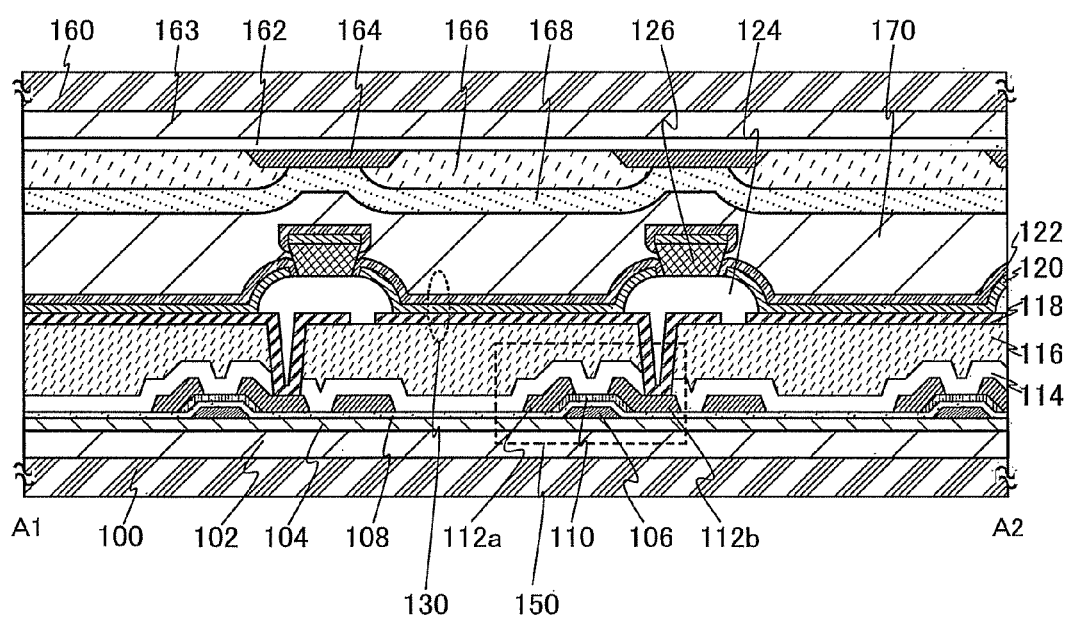

In the light-emitting device shown in FIG. 1B, a first substrate 100 over which the transistors 150, a light-emitting element 130 formed over the transistors, 150, the partition walls 124 formed apart from each other between the pixels, and the structure bodies 126 are formed; and a second substrate 160 provided with a light shielding film 164 and a color filter 166 are bonded to each other using a first bonding layer 170.

Note that the first substrate 100 and the second substrate 160 have flexibility. In this specification and the like, a substrates having flexibility is referred to as a flexible substrate.

Further, the light-emitting device shown in FIG. 1B is a light-emitting device having a so-called top emission structure in which light from the light-emitting element 130 is emitted from the second substrate 160 side through the color filter 166.

The first substrate 100 includes a second bonding layer 102 provided over the first substrate 100, a first buffer layer 104 provided over the second bonding layer 102, and the transistors 150 provided over the first buffer layer 104, which control driving of the light-emitting element, the light-emitting element 130 electrically connected to the transistors 150, the partition walls 124 which separate the light-emitting element 130, and the structure bodies 126 provided over the partition walls 124.

The transistor 150 includes a gate electrode layer 106 formed over the first buffer layer 104, a gate insulating layer 108 formed over the gate electrode layer 106, a semiconductor layer 110 formed over the gate insulating layer 108, and a source electrode layer 112a and a drain electrode layer 112b formed over the semiconductor layer 110. Further, the transistor 150 is covered with a first insulating layer 114 and a second insulating layer 116. A first electrode layer 118 is formed over the second insulating layer 116, a light-emitting layer 120 is formed over the first electrode layer 118, and the second electrode layer 122 is formed over the light-emitting layer 120.

Although not shown in FIG. 1B, the transistor 152 shown in FIG. 1A has the same structure as the transistor 150. However, the size (e.g., channel length and channel width) of each transistor and a connection and the like of the transistors can be adjusted as appropriate.

Further, the light-emitting element 130 is formed using the first electrode layer 118, the light-emitting layer 120, and the second electrode layer 122. Further, the light-emitting element 130 is electrically connected to the transistor 150 through an opening provided in the first insulating layer 114 and the second insulating layer 116.

Further, light-emitting element 130 is separated by the partition walls 124 and the structure bodies 126, whereby pixels are formed. Note that the function of the partition wall 124 is different from that of the structure body 126.

The partition wall 124 is provided so as to prevent disconnection of the light-emitting element 130 due to steps of the opening and the like provided in the first electrode layer 118, the first insulating layer 114, and the second insulating layer 116. Thus, it is preferable that the partition wall 124 have a forward tapered shape so that a film formed over the partition wall 124 is prevented from being broken. In a forward tapered shape, a layer gradually increases in thickness and is in contact with a layer serving as a base.

On the other hand, the structure body 126 is provided so as to separate the light-emitting layer 120. In this embodiment, the structure in which the second electrode layer 122 is also separated together with the separation of the light-emitting layer 120 is illustrated; however, the second electrode layer 122 is not necessarily separated. However, the structure body 126 separates the light-emitting layer 120, and a part of the structure body 126 is in contact with the second electrode layer 122 or the first bonding layer 170.

The structure body 126 has a region which is in contact with the second electrode layer 122 or the first bonding layer 170 without interposing the light-emitting layer 120 therebetween. The region of the structure body 126, which is in contact with the second electrode layer 122 or the first bonding layer 170 without interposing the light-emitting layer 120 therebetween, can have high adhesion. By providing the structure body 126 between the pixels, the light-emitting element 130 is protected. Thus, with the region having improved adhesion provided in the structure body 126, the light-emitting element 130 can be prevented from being damaged when external physical force is applied.

Here, a method for manufacturing the light-emitting device shown in FIG. 1B is described in detail with reference to FIGS. 2A to 2D, FIGS. 3A to 3C, FIGS. 4A and 4B, and FIGS. 5A and 5B.

<Method for Manufacturing Light-Emitting Device>

First, a first separation layer 101 is formed over a third substrate 180, and a first buffer layer 104 is formed over the first separation layer 101. It is preferable that the first buffer layer 104 be formed successively so that the first separation layer 101 is not exposed to air. The successive formation prevents dust or impurities from entering a portion between the first separation layer 101 and the first buffer layer 104 (see FIG. 2A).

The third substrate 180 may be a glass substrate, a quartz substrate, a sapphire substrate, a ceramic substrate, a metal substrate, or the like. Alternatively, a plastic substrate having heat resistance to the processing temperature of this embodiment may be used. In the case where a plastic substrate is used, the separation layer 101 is not necessarily provided.

In the case where a glass substrate is used and the temperature at which the heat treatment is to be performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a large amount of barium oxide (BaO), a glass substrate which is heat-resistant and more practical can be obtained. Alternatively, crystallized glass or the like may be used.

In this embodiment, the first separation layer 101 is formed in contact with the third substrate 180; however, when a glass substrate is used for the third substrate 180, it is further preferable to form an insulating layer such as a silicon oxide film, a silicon oxynitride film, a silicon nitride film, or a silicon nitride oxide film between the third substrate 180 and the first separation layer 101 because contamination from the glass substrate can be prevented by the formation of the insulating layer.

The first separation layer 101 has a single-layer structure or a stacked structure containing an element selected from tungsten, molybdenum, titanium, tantalum, niobium, nickel, cobalt, zirconium, ruthenium, rhodium, palladium, osmium, iridium, or silicon; an alloy material containing any of the elements; or a compound material containing any of the elements. A crystal structure of a layer containing silicon may be amorphous, microcrystal, or polycrystal.

The first separation layer 101 can be formed by a sputtering method, a plasma CVD method, a coating method, a printing method, or the like. Note that the coating method includes a spin coating method, a droplet discharge method, and a dispensing method.

When the first separation layer 101 has a single-layer structure, preferably, a tungsten layer, a molybdenum layer, or a layer containing a mixture of tungsten and molybdenum is formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

When the first separation layer 101 has a stacked structure including a layer containing tungsten and a layer containing an oxide of tungsten, it may be utilized that the layer containing tungsten is formed first and an insulating layer formed of oxide is formed thereover so that a layer containing an oxide of tungsten is formed at the interface between the tungsten layer and the insulating layer. Alternatively, the layer containing oxide of tungsten may be formed by performing thermal oxidation treatment, oxygen plasma treatment, treatment with a highly oxidizing solution such as ozone water, or the like on the surface of the layer containing tungsten. Further, plasma treatment or heat treatment may be performed in an atmosphere of oxygen, nitrogen, nitrous oxide alone, or a mixed gas of any of these gasses and another gas. Surface condition of the first separation layer 101 is changed by the plasma treatment or heat treatment, whereby adhesion between the first separation layer 101 and the first buffer layer 104 to be formed later can be controlled.

Next, the first buffer layer 104 is formed over the first separation layer 101. The first buffer layer 104 is preferably formed using a single layer or stacked layers of a silicon nitride layer, a silicon oxynitride layer, a silicon nitride oxide layer, or the like.

The first buffer layer 104 can be formed by a sputtering method, a plasma CVD method, a coating method, a printing method, or the like. For example, the first buffer layer 104 is formed at a temperature of higher than or equal to 250° C. and lower than or equal to 400° C. by a plasma CVD method, whereby a dense film having very low water permeability can be obtained. Note that the thickness of the first buffer layer 104 is preferably greater than or equal to 10 nm and less than or equal to 3000 nm, further preferably greater than or equal to 200 nm and less than or equal to 1500 nm.

Figure 2A:
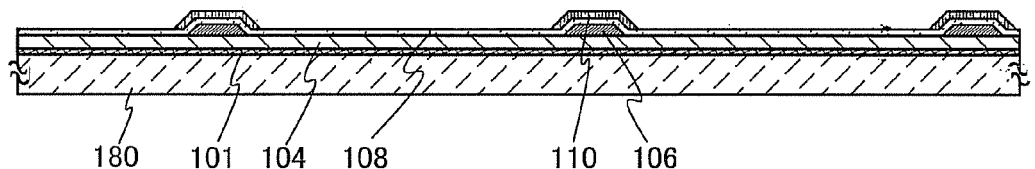
FIGS. 2A to 2D are cross-sectional views illustrating a method for manufacturing a light-emitting device.

Next, a conductive film is formed over the first buffer layer 104, and a photolithography step and an etching step are performed, so that the gate electrode layer 106 is formed (see FIG. 2A).

The gate electrode layer 106 can be formed using a single layer or stacked layers of a metal material such as molybdenum, titanium, chromium, tantalum, tungsten, aluminum, copper, neodymium, or scandium, or an alloy material which contains any of these elements.

The gate insulating layer 108 is formed over the gate electrode layer 106. The gate insulating layer 108 can be formed using a single layer or stacked layers of silicon oxide, silicon nitride, silicon oxynitride, silicon nitride oxide, or aluminum oxide by a plasma CVD method, a sputtering method, or the like. For example, a silicon oxynitride film may be formed using a deposition gas containing $SiH_4$ and $N_2O$ by a plasma CVD method.

Next, a semiconductor layer is formed, and a photolithography step and an etching step are performed thereon, so that an island-shaped semiconductor layer 110 is formed (see FIG. 2A).

The semiconductor layer 110 can be formed using a silicon semiconductor or an oxide semiconductor. As a silicon semiconductor, single, crystal silicon, polycrystalline silicon, or the like can be used as appropriate. As an oxide semiconductor, an In—Ga—Zn—O-based metal oxide or the like can be used as appropriate. Note that as the semiconductor layer 110, an oxide semiconductor which is an In—Ga—Zn—O-based metal oxide is preferably used so that the semiconductor layer have low off-state current, because an off state leakage current of a light-emitting element to be formed later can be reduced.

Figure 2B:
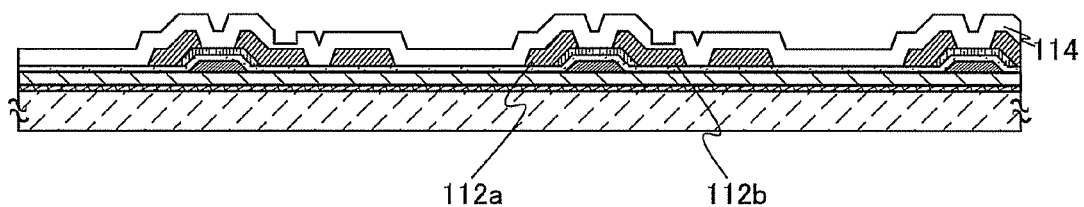

Next, a conductive film is formed over the gate insulating layer 108 and the semiconductor layer 110, and the source electrode layer 112a and the drain electrode layer 112b are formed by a photolithography step and an etching step (see FIG. 2B).

As the conductive film used for the source electrode layer 112a and the drain electrode layer 112b, for example, a metal film including an element selected from Al, Cr, Cu, Ta, Ti, Mo, and W, a metal nitride film including any of these elements (a titanium nitride film, a molybdenum nitride film, or a tungsten nitride film), or the like can be used. A metal film having a high melting point such as Ti, Mo, or W or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer 112a and the drain electrode layer 112b may be formed using a conductive metal oxide. As the conductive metal oxide, indium oxide ($In_2O_3$ or the like), tin oxide ($SnO_2$ or the like), zinc oxide (ZnO or the like), ITO, indium oxide-zinc oxide alloy ($In_2O_3$—ZnO or the like), or any of these metal oxide materials in which silicon oxide is contained can be used.

Then, the first insulating layer 114 is formed over the semiconductor layer 110, the source electrode layer 112a, and the drain electrode layer 112b (see FIG. 2B). As the first insulating layer 114, typically, an inorganic insulating film such as a silicon oxide film, a silicon oxynitride film, or an aluminum oxide film can be used.

Figure 2C:
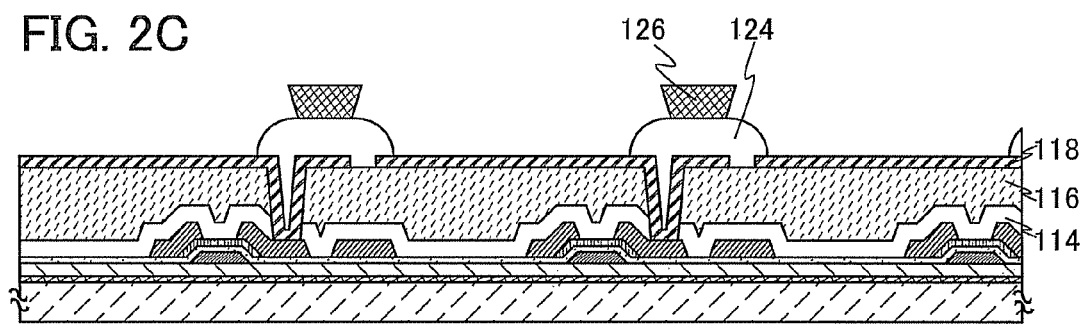

Next, the second insulating layer 116 is formed over the first insulating layer 114 (see FIG. 2C).

As the second insulating layer 116, an insulating film with a planarization function is preferably selected in order to reduce surface unevenness due to the transistor. For example, an organic material such as polyimide, acrylic, benzocyclobutene, or the like can be used. Other than such organic materials, a low-dielectric constant material (a low-k material) or the like can be used. Note that the second insulating layer 116 may be formed by stacking a plurality of insulating films formed using any of these materials.

The opening which reaches the drain electrode layer 112b is formed in the first insulating layer 114 and the second insulating layer 116 by a photolithography step and an etching step. As a method for forming the opening, a dry etching method, a wet etching method, or the like may be selected as appropriate.

Then, a conductive film is formed over the second insulating layer 116 and the drain electrode layer 112b, and a photolithography step and an etching step are performed thereon, whereby the first electrode layer 118 is formed (see FIG. 2C).

As the first electrode layer 118, a material which reflects light emitted from the light-emitting layer 120 (to be formed later) efficiently is preferable. This is because light-extraction efficiency can be improved. Note that the first electrode layer 118 may have a stacked structure. For example, a conductive film of metal oxide, a titanium film, or the like is formed thin on the side which is in contact with the light-emitting layer 120, and a metal film (aluminum, an alloy of aluminum, silver, or the like) which has high reflectance can be used on the other side. With such a structure, the formation of an insulating film between the light-emitting layer 120 and the metal film (aluminum, an alloy of aluminum, silver, or the like) which has high reflectance can be suppressed, which is preferable.

In this embodiment, the light-emitting device having a top emission structure is illustrated. However, by using a light-transmitting material for the first electrode layer 118, a light-emitting device having a bottom emission structure and a dual emission structure can be manufactured.

Subsequently, the partition wall 124 is formed over the first electrode layer 118 (see FIG. 2C).

For the partition wall 124, an organic insulating material or an inorganic insulating material is used. It is particularly preferable that the partition wall 124 be formed using a photosensitive resin material and a sidewall of the partition wall 124 be formed to have an inclined surface with continuous curvature.

Then, the structure body 126 is formed over the partition wall 124 (see FIG. 2C).

The shape of the structure body 126 is important because the structure body 126 needs to separate the light-emitting layer 120 to be formed later. For example, the structure body 126 described in this embodiment has an inverse tapered shape. The inverse tapered shape as used herein refers a shape in which the side or the top side thereof protrudes from the bottom side in a direction parallel to the substrate.

The structure body 126 can be formed using an inorganic insulating material, an organic insulating material, or a metal material. As the organic insulating material, for example, a negative or positive type photosensitive resin material, a negative or positive type non-photosensitive resin material, or the like can be used. As the metal material, titanium, aluminum, or the like can be used.

Subsequently, the light-emitting layer 120 is formed over the first electrode layer 118, the partition wall 124, and the structure body 126 (see FIG. 2D).

The light-emitting layer 120 can be formed by an evaporation method (including a vacuum evaporation method), or the like. The light-emitting layer 120 may have a single-layer or a stacked structure. Light emitted from the light-emitting layer 120 is preferably white, and light having a peak in each of red, green, and blue wavelength regions is preferable.

In this embodiment, a structure in which light emitted from the light-emitting layer 120 is emitted through a color filter 166 is illustrated; however, the structure is not limited thereto. A structure may be employed in which the light-emitting layers 120 separately colored with different colors (e.g., R, G and B) are formed without the color filter 166. However, the number of steps and the cost may be increased by separately coloring the light-emitting layers 120 with different colors; thus, the structure using a white light-emitting layer 120 and the color filter 166 described in this embodiment is preferable.

Further, the light-emitting layer 120 is formed by being separated by the structure body 126. Because the structure body 126 has an inverse tapered shape, the structure body 126 can separate the light-emitting layer 120 without a film wrapped around the bottom portion of the structure body 126 in the formation of the light-emitting layer 120. Note that the light-emitting layer 120 is formed over the top portion and part of the side portion of the structure body 126.

Figure 2D:
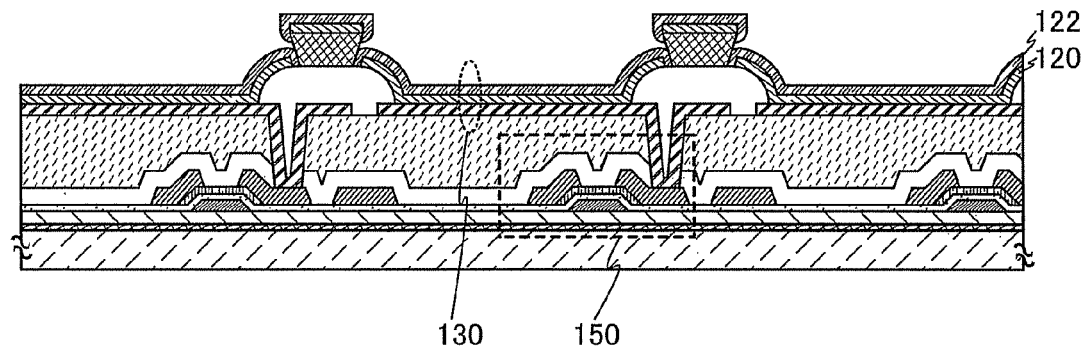

Next, the second electrode layer 122 is formed over the light-emitting layer 120 (see FIG. 2D).

In this embodiment, the second electrode layer 122 as well as the light-emitting layer 120 is separated by the structure body 126. Note that the second electrode layer 122 is formed over the top portion and part of the side portion of the structure body 126 and the light-emitting layer 120.

The second electrode layer 122 can be formed using a light-transmitting metal oxide. As the light-transmitting metal oxide, indium oxide ($In_2O_3$ or the like), tin oxide ($SnO_2$ or the like), zinc oxide (ZnO), indium oxide-tin oxide alloy ($In_2O_3$—$SnO_2$ or the like, which is abbreviated to ITO), indium oxide-zinc oxide alloy ($In_2O_3$—ZnO or the like), or any of these metal oxide materials in which silicon oxide is contained can be used.

Note that one of the first electrode layer 118 and the second electrode 122 functions as an anode of the light-emitting layer 120, and the other functions as a cathode of the light-emitting layer 120. It is preferable to use a substance having a high work function for the electrode which functions as an anode, and a substance having a low work function for the electrode which functions as a cathode.

The light-emitting element 130 is formed using the first electrode layer 118, the light-emitting layer 120, and the second electrode layer 122.

Through the above steps, the third substrate 180 provided with the transistor 150 which control driving of light-emitting element, and the light-emitting element 130 is formed.

Then, a method for manufacturing a fourth substrate 190 over which the light shielding film 164, the color filter 166, and an overcoat 168 are formed is described below.

Figure 3A:
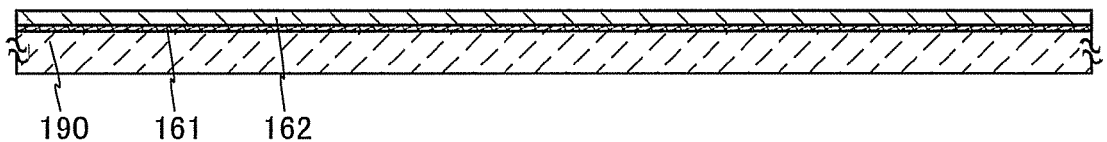
FIGS. 3A to 3C are cross-sectional views illustrating a method for manufacturing a light-emitting device.

First, a second separation layer 161 is formed over the fourth substrate 190 and then a second buffer layer 162 is formed over the second separation layer 161 (see FIG. 3A).

The second separation layer 161 and the second buffer layer 162 can be formed using a material and a method similar to those of the first separation layer 101 and the first buffer layer 104.

Figure 3B:
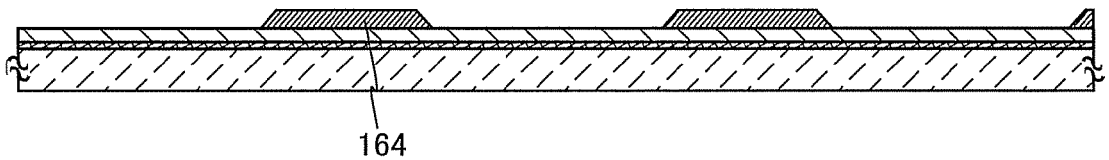

Then, a conductive film is formed over the second buffer layer 162, and a photolithography step and an etching step are performed thereon, whereby the light shielding film 164 is formed (see FIG. 3B).

By the light shielding film 164, color mixture between pixels can be prevented. As the light shielding film 164, a low reflectance metal film such as a titanium film or a chromium film, or an organic resin film impregnated with black pigment or black dye can be used. However, the light shielding film 164 is not necessarily provided.

Figure 3C:
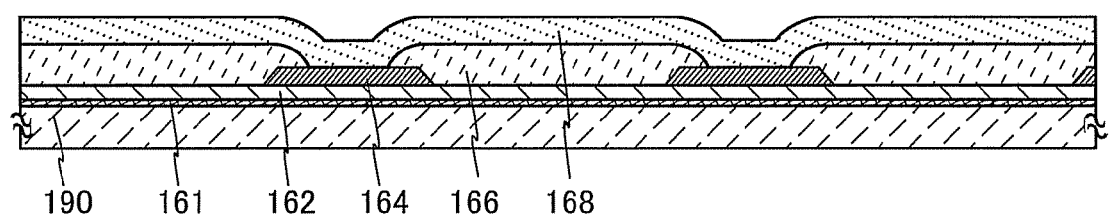

Then, the color filter 166 is formed over the second buffer layer 162 and the light shielding film 164 (see FIG. 3C).

The color filter 166 is a colored layer which transmits light of a specific wavelength band. For example, a red color filter which transmits light of a red (R) wavelength band, a green color filter which transmits light of a green (G) wavelength band, a blue color filter which transmits light of a blue (B) wavelength band, and the like can be used. Each color filter is formed in a desired position with a known material by a printing method, an inkjet method, an etching method using a photolithography technique, or the like.

Here, a method of using three colors of R, G and B is described; however, the present invention is not limited thereto. A structure in which four colors of R, B, and Y (yellow) are used or a structure in which five or more colors are used is possible.

Subsequently, the overcoat 168 is formed over the light shielding film 164 and the color filter 166 (see FIG. 3C).

The overcoat 168 can be formed using an organic resin film formed of acrylic, polyimide, or the like. The overcoat 168 can prevent diffusion of an impurity component and the like contained in the color filter 166 to the light-emitting layer 120 side. The overcoat 168 may have a stacked structure of an organic resin film and an inorganic insulating film. The inorganic insulating film can be formed using silicon nitride, silicon oxide, or the like. Note that the overcoat 168 is not necessarily provided.

Through the above steps, the fourth substrate 190 over which the second separation layer 161, the second buffer layer 162, the light shielding film 164, the color filter 166, and the overcoat 168 are formed is formed.

Figure 4A:
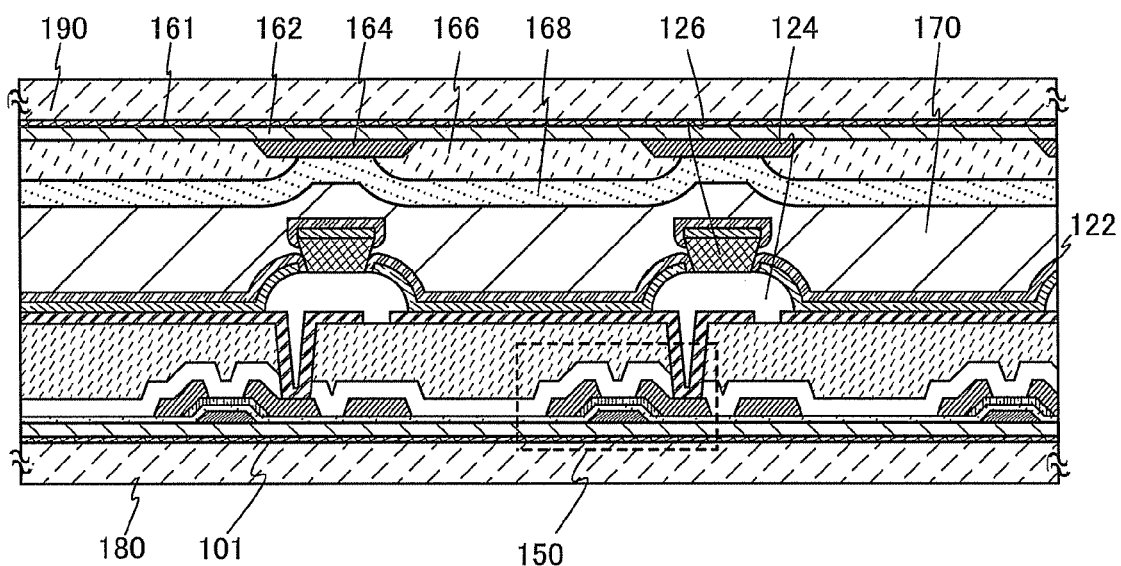
FIGS. 4A and 4B are cross-sectional views illustrating a method for manufacturing a light-emitting device.

Next, the third substrate 180 and the fourth substrate 190 are aligned and bonded to each other using the first bonding layer 170 (see FIG. 4A).

There is no particular limitation on the first bonding layer 170, and a light-transmitting adhesive having high refractive index and capable of bonding the third substrate 180 and the fourth substrate 190 can be used. A substance having molecular size less than or equal to the wavelength of light and functioning as a dry agent (zeolite or the like), or a filler with a high refractive index (titanium oxide, zirconium, or the like) is preferably mixed to the adhesive because reliability and light-extraction efficiency of the light-emitting element 130 are improved.

Further, a sealing film with low moisture permeability may be formed between the first bonding layer 170 and the second electrode layer 122. As the sealing film with low moisture permeability, for example, silicon oxide, silicon nitride, aluminum oxide, or the like can be used.

Figure 4B:
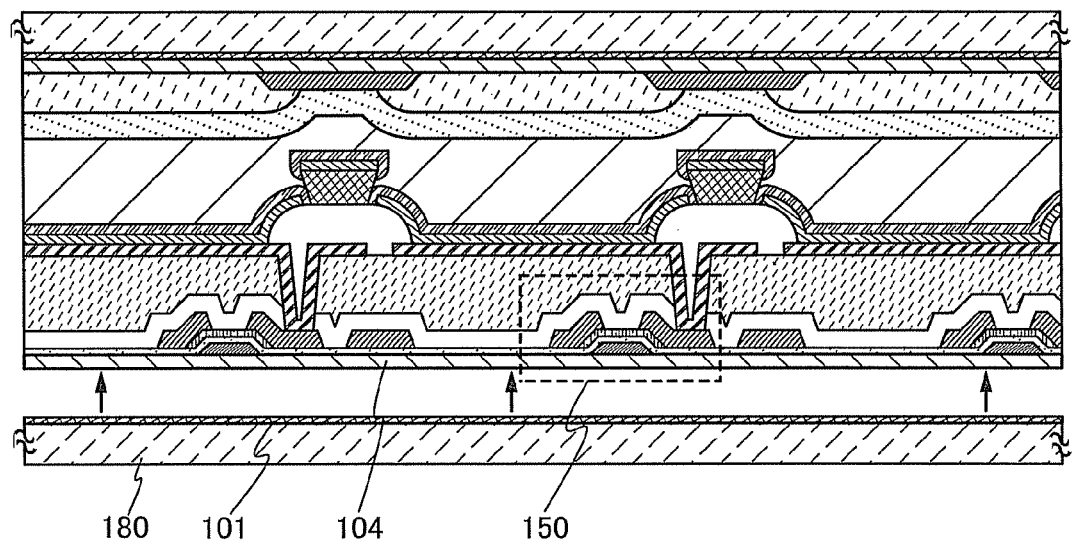

Separation is performed between the first separation layer 101 and the first buffer layer 104 which are formed over the third substrate 180 (see FIG. 4B). Any of various methods can be employed as a separation method.

For example, a metal oxide film is formed at the interface between the first separation layer 101 and the first buffer layer 104 by heating the first separation layer 101 and the first buffer layer 104 in a step of forming the transistor 150. A groove (not shown) reaching the first separation layer 101 is formed, and the metal oxide film is embrittled because of the groove, so that the separation is performed at the interface between the first separation layer 101 and the first buffer layer 104.

The size of the first separation layer 101 faulted over the third substrate 180 and the size of the second separation layer 161 formed over the fourth substrate 190 may be different in a plane direction. For example, it is preferable that the second separation layer 161 be formed smaller than the first separation layer 101, because the groove is easily formed in the second separation layer 161 after the third substrate 180 is bonded to the fourth substrate 190.

As the separation method, mechanical force (a separation process with a human hand or with a gripper, a separation process by rotation of a roller, or the like) may be used. Alternatively, the first buffer layer 104 may be separated from the first separation layer 101 in such a manner that a liquid is dropped into the groove to allow the liquid to be infiltrated into the interface between the first separation layer 101 and the first buffer layer 104. Further alternatively, a method may be used in which a fluoride gas such as $NF_3$, $BrF_3$, or $ClF_3$ is introduced into the groove and the first separation layer 101 is removed by etching with the use of the fluoride gas so that the first buffer layer 104 is separated from the third substrate 180 having an insulating surface.

As another separation method, in the case where the first separation layer 101 is formed using tungsten, separation can be performed while the separation layer 101 is etched by a mixed solution of ammonia water and hydrogen peroxide water.

When a film containing nitrogen, oxygen, hydrogen, or the like (e.g., an amorphous silicon film containing hydrogen, an alloy film containing hydrogen, or an alloy film containing oxygen) is used as the first separation layer 101 and a substrate having a light-transmitting property is used as the third substrate 180, the following method can be used: the first separation layer 101 is irradiated with laser light through the third substrate 180, and nitrogen, oxygen, or hydrogen contained in the separation layer 101 is evaporated, so that separation can occur between the third substrate 180 and the first separation layer 101.

Figure 5A:
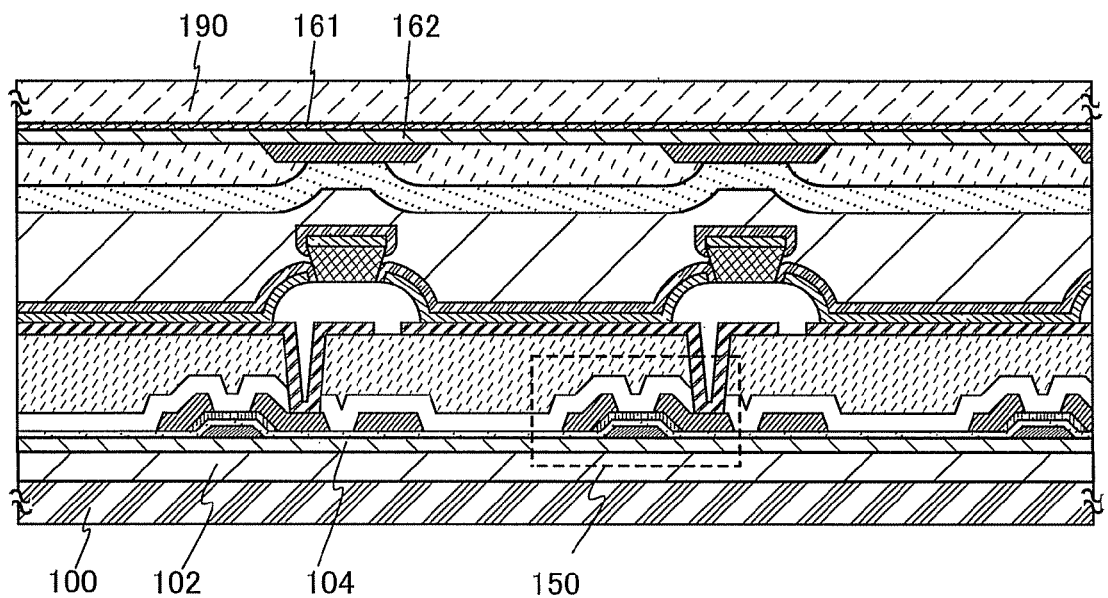
FIGS. 5A and 5B are cross-sectional views illustrating a method for manufacturing a light-emitting device.

Subsequently, the first buffer layer 104 is bonded to the first substrate 100 using the second bonding layer 102 (see FIG. 5A).

In this specification and the like, a process in which a buffer layer formed over a separation layer is separated from the separation layer formed over a substrate and is bonded to another substrate is referred to as separation and transposition.

As the first substrate 100, a substrate having flexibility and a light-transmitting property with respect to visible light can be used. For example, it is preferable to use a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, or a polyvinylchloride resin, or the like. In addition, over the first substrate, a protective film having low water permeability may be formed in advance, and examples thereof include a film containing nitrogen and silicon such as a silicon nitride film or a silicon oxynitride film, a film containing nitrogen and aluminum such as an aluminum nitride film, and the like. Note that a structure in which a fibrous body is impregnated with an organic resin (also referred to as so-called a prepreg) may be used as the first substrate 100.

The light-emitting device described in this embodiment is a top emission type light-emitting device in which light is extracted from the second substrate 160 side; thus, a non-light-transmitting metal substrate that is made thin enough to have flexibility may be used as the first substrate 100. The metal substrate is provided on the side through which light is not extracted. A material for forming the metal substrate is not limited to a particular material, but aluminum, copper, nickel, an alloy of metal such as an aluminum alloy or stainless steel, or the like can be preferably used.

In the case where a fibrous body is included in the material of the first substrate 100, a high-strength fiber of an organic compound or an inorganic compound is used as the fibrous body. A high-strength fiber is specifically a fiber with a high tensile modulus of elasticity or a fiber with a high Young's modulus. As a typical example of a high-strength fiber, a polyvinyl alcohol based fiber, a polyester based fiber, a polyamide based fiber, a polyethylene based fiber, an aramid based fiber, a polyparaphenylene benzobisoxazole fiber, a glass fiber, or a carbon fiber can be given. As a glass fiber, there is a glass fiber using E glass, S glass, D glass, Q glass, or the like. These fibers may be used in a state of a woven fabric or a nonwoven fabric, and a structure in which this fibrous body is impregnated with an organic resin and the organic resin is cured may be used as the first substrate 100. When the structure including the fibrous body and the organic resin is used as the first substrate 100, reliability against bending or breaking due to local pressure can be increased, which is preferable.

As the second bonding layer 102, various curable adhesives, e.g., a light curable adhesive such as a UV curable adhesive, a reactive curable adhesive, a thermal curable adhesive, and an anaerobic adhesive can be used. As the material of the adhesive, an epoxy resin, an acrylic resin, a silicone resin, a phenol resin, or the like can be used.

Note that in the case where a prepreg is used as the first substrate 100, the first substrate 100 and the first buffer layer 104 may be bonded to each other by pressure bonding without using the second bonding layer 102.

Figure 5B:
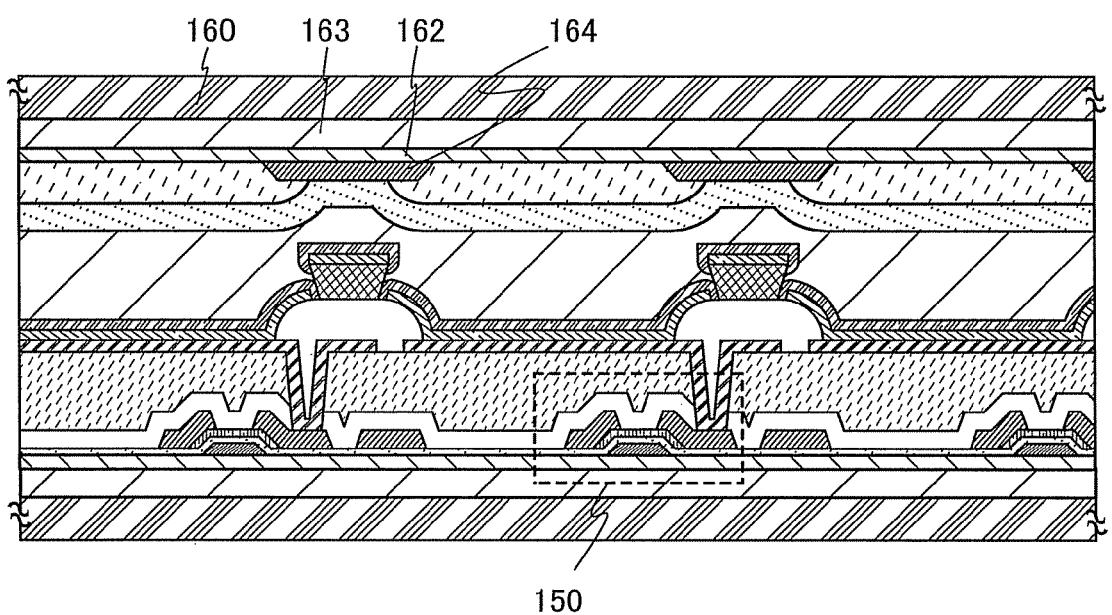

Next, separation is performed between the second separation layer 161 and the second buffer layer 162 which are faulted over the fourth substrate 190; then, the buffer layer 162 is bonded to the second substrate 160 using the third bonding layer 163 (see FIG. 5B).

The separation can be performed by a method similar to the above described method used for the separation between the first separation layer 101 and the first buffer layer 104 which are formed over the third substrate 180. Further, the second substrate 160 and the third bonding layer 163 can be formed using a material and a method similar to those used for forming the first substrate 100 and the second bonding layer 102.

Through these steps, a light-emitting device formed over a flexible substrate can be manufactured.

In this embodiment, a method is illustrated in which the third substrate 180 is separated and then the fourth substrate 190 is separated. However, the invention disclosed in this specification is not limited thereto, and the following method may be employed, in which the fourth substrate 190 is separated and then the third substrate 180 is separated.

In this embodiment, a method is described in which the transistor 150, the light-emitting element 130, the color filter 166, and the like are transposed to the first substrate 100 and the second substrate 160 by separation and transposition; however, the invention disclosed in this specification is not limited thereto. The transistor 150, the light-emitting element 130, the color filter 166, and the like may be directly formed over the first substrate 100 and the second substrate 160.

Although an active matrix light-emitting device is described as an example of a light-emitting device in this embodiment, the present invention can also be applied to a passive matrix light-emitting device.

A highly reliable light-emitting device in which a light-emitting element is prevented from being damaged when external physical force is applied can be provided by the provision of the above-described structure body.

Further, in the case where separation and transposition which are described in this embodiment are used as a method for making a flexible substrate, a light-emitting element can be prevented from being damaged and the light-emitting element can be transposed to a flexible substrate after the separation by the provision of the above-described structure body.

Embodiment 1 can be implemented in appropriate combination with the structures described in the other embodiments.

Embodiment 2

A structure body used for a light-emitting device of the present invention, which has a different structure from the structure body 126 described in Embodiment 1, will be described with reference to FIGS. 6A to 6D.

Note that the same reference numerals are used for the same parts as those of the light-emitting device in Embodiment 1, and description of the parts with the same reference numerals will be omitted here.

Figure 6A:
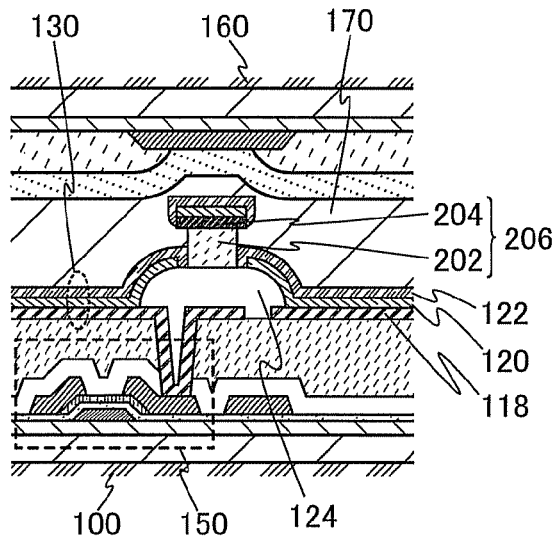
FIGS. 6A to 6D are cross-sectional view illustrating a structure body provided in a light-emitting device.

The light-emitting device shown in FIG. 6A has a structure body 206 including a first structure body 202 and a second structure body 204 over the partition wall 124.

As a method for forming the structure body 206, a film formed of an organic insulating material is formed; then, a film formed of an inorganic insulating material is formed thereover. After that patterning is performed on a desired region, the film formed of the inorganic insulating material is processed, and then the film formed of the organic insulating material is processed using the film formed of the inorganic insulating material as a mask (so-called hard mask). The film formed of the organic insulating material can be processed by wet etching, dry etching, or the like. A portion formed using the film formed of the organic insulating material is the first structure body 202, and a portion formed using the film formed of the inorganic insulating material is the second structure body 204.

As the material used for the first structure body 202, for example, a negative or positive type photosensitive resin material, a negative or positive type non-photosensitive resin material, or the like can be used. In the case where a non-light-transmitting metal is used for the second structure body 204, the second structure body 204 is used as a light shielding film, and the first structure body 202 may be formed by light exposure or the like.

As a material used for the second structure body 204, for example, an inorganic insulating material such as silicon oxide or silicon nitride, a conductive metal material such as titanium or aluminum, or the like can be used.

The structure body 206 separates the light-emitting layer 120 and the second electrode layer 122 by its shape. Thus, the structure body 206 is in contact with the first bonding layer 170 and the second electrode layer 122. That is, a region of the structure body 206, which is in contact with the first bonding layer 170 and the second electrode layer 122 without interposing the light-emitting layer 122 therebetween, is provided. With this structure, adhesion can be improved. By providing the structure body 206 between pixels, the light-emitting element 130 is protected. Accordingly, with the region having improved adhesion provided in the structure body 206, the light-emitting element 130 can be prevented from being damaged when external physical force is applied.

Figure 6B:
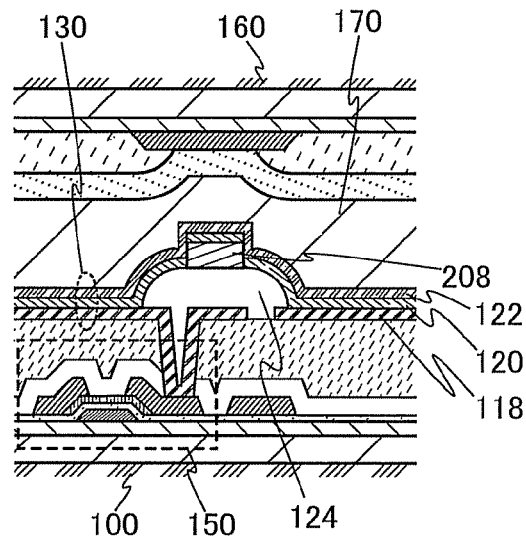

The light-emitting device shown in FIG. 6B has a structure body 208 over the partition wall 124.

The shape of the side surface of the structure body 208 is different from that of the structure body 126 described in Embodiment 1. The side surface of the structure body 208 is substantially perpendicular to the substrate.

The method and the material for forming the structure body 208 are as follows. A film formed of an inorganic insulating material is formed; patterning is performed on a desired region; and the film formed of the inorganic material is processed. As the film formed of the inorganic insulating material, for example, an inorganic insulating material such as silicon oxide or silicon nitride, a conductive metal material such as titanium or aluminum, or the like can be used.

The structure body 208 separates the light-emitting layer 120 by its shape. Note that the structure body 208 separates only the light-emitting layer 120 and does not separate the second electrode layer 122. That is, the second electrode layer 122 is continuously formed extending to adjacent pixels in the side surfaces of the structure body 208. In the side surfaces of the structure body 208, the structure body 208 and the second electrode layer 122 are in contact with each other. With this structure, a region of the structure body 208, which is in contact with the second electrode layer 122 without interposing the light-emitting layer 120 is provided, whereby adhesion can be improved. By providing the structure body 208 between pixels, the light-emitting element 130 is protected. Accordingly, with the region having improved adhesion provided in the structure body 208, the light-emitting element 130 can be prevented from being damaged when external physical force is applied.

Figure 6C:
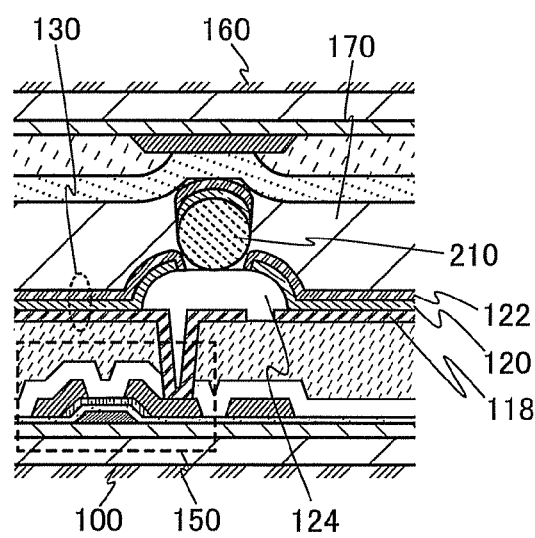

The light-emitting device shown in FIG. 6C has a structure body 210 over the partition wall 124.

The structure body 210 has a spherical shape (a round shape in a cross section), which has both a function of separating the light-emitting layer 120 and the second electrode layer 122 and a function as a spacer adjusting an interval (a so-called cell gap) between the first substrate 100 and the second substrate 160 at the same time. Note that the structure body 126 described in Embodiment 1, and the structure bodies 206, 208, and 214 described in this embodiment may each have a function as a spacer as well as the structure body 210.

The structure body 210 separates the light-emitting layer 120 and the second electrode layer 122 by its shape. Thus, the structure body 210 is in contact with the first bonding layer 170 and the second electrode layer 122. That is, a region of the structure body 210, which is in contact with the first bonding layer 170 or the second electrode layer 122 without interposing the light-emitting layer 122, is provided. With this structure, adhesion can be improved, and the light-emitting element 130 is protected by providing the structure body 210 between pixels. Accordingly, with the region having improved adhesion provided in the structure body 210, the light-emitting element 130 can be prevented from being damaged when external physical force is applied.

Figure 6D:
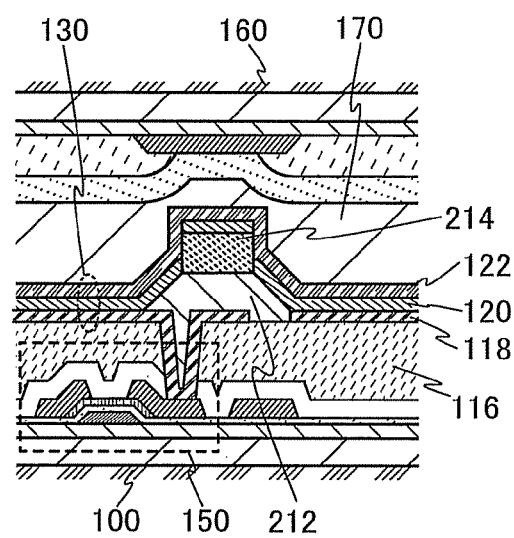

The light-emitting device shown in FIG. 6D illustrates a structure in which the shape of a partition wall and the shape of a structure are different from those of the light-emitting device described in Embodiment 1.

The light-emitting device shown in FIG. 6D has a partition wall 212 over the second insulating layer 116 and the first electrode layer 118, and the structure body 214 over the partition wall 212.

The method and the material for forming the partition wall 212 and the structure body 214 are as follows. First, silicon oxide is formed; then, silicon nitride, titanium, or aluminum is formed. After that, patterning is performed on a desired region and silicon nitride, titanium, aluminum, or the like is processed. The silicon oxide is processed using the processed silicon nitride, titanium, aluminum, or the like as a hard mask, whereby the partition wall 212 and the structure body 214 are formed. It is preferable that the partition wall 212 and the structure body 214 be formed at the same time since the number of masks can be reduced by one and manufacturing cost can be reduced.

Further, the structure body separates only the light-emitting layer 120 and does not separate the second electrode layer 122. That is, the second electrode layer 122 is continuously formed extending to adjacent pixels in the side surfaces of the structure body 214. In the side surfaces of the structure body 214, the structure body 214 and the second electrode layer 122 are in contact with each other. With this structure, a region of the structure body 214, which is provided in contact with the second electrode layer 122 without interposing the light-emitting layer 120 therebetween is provided, whereby adhesion can be improved. By providing the structure body 214 between pixels, the light-emitting elements 130 is protected. Accordingly, with the region having improved adhesion provided in the structure body 214, the light-emitting element 130 can be prevented from being damaged when external physical force is applied.

Note that the structure body 126 described in Embodiment 1 and the structure bodies 206, 208, 210, and 214 described in this embodiment can each function as an auxiliary electrode by using a conductive metal material for each of the structure bodies.

Specifically, a light-transmitting material used for the second electrode layer 122 has relatively high resistance. Thus, when the area of the light-emitting element 130 is increased, voltage drop due to the resistance is large in the case where the resistance of the second electrode layer 122 is high, and luminance gradient between pixels may be generated. For that reason, by making the structure body function as an auxiliary electrode, the luminance gradient between pixels can be reduced. However, when the structure body functions as the auxiliary electrode, the arrangement of the structure body is important. The arrangement of the structure body is described in detail in Embodiment 3 below.

It is preferable that the materials used for the structure body 126 described in Embodiment 1 and the structure bodies 206, 208, 210, and 214 described in this embodiment each include a dry agent. As a material which can be used as the dry agent, for example, aluminum oxide, zeolite, or the like can be used. Using such a material, moisture and the like which enters the light-emitting element 130 can be absorbed by the structure body, and reliability of the light-emitting element 130 can be improved.

As described above, this embodiment can provide a highly reliable light-emitting device in which a light-emitting element can be prevented from being damaged when external physical force is applied.

Embodiment 2 can be implemented in appropriate combination with the structures described in the other embodiments.

Embodiment 3

In this embodiment, description is made on the arrangement of pixels of light-emitting devices in which the structure body 126 described in Embodiment 1 and the structure bodies 206, 208, 210, and 214 described in Embodiment 2 are used with reference to FIGS. 7A to 7D.

FIGS. 7A to 7D are top views of part of pixels of the light-emitting device. In this embodiment, the position of the structure body in each pixel is described; thus, some components (for example, the transistor 150, the light-emitting element 130, and the like) of the present invention are omitted in order to avoid complex views each of the light-emitting devices shown in FIGS. 7A to 7D, a plurality of source wirings 156 is provided parallel to (extending in the vertical direction in the drawing) and apart from each other, and a plurality of gate wirings 154 is provided parallel to (extending in the horizontal direction in the drawing) and apart from each other. A substantially rectangular region is surrounded by the source wirings 156 and the gate wirings 154. This region serves as one pixel of the light-emitting device, and a plurality of pixels is arranged in matrix.

Figure 7A:
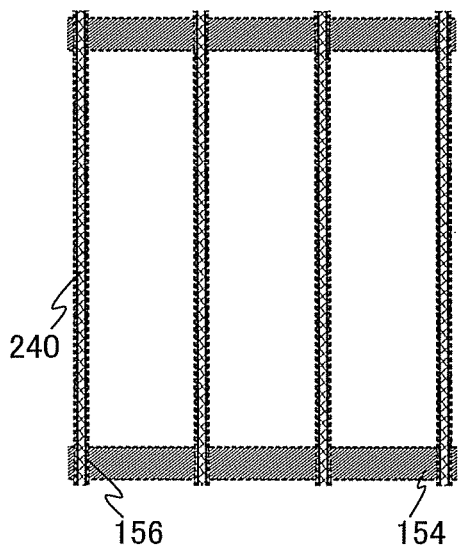
FIGS. 7A to 7D are top views illustrating a structure body provided in a light-emitting device.

In the light-emitting device shown in FIG. 7A, structure bodies 240 are formed to substantially overlap with the plurality of source wirings 156. That is, the structure bodies 240 are arranged in stripes in such a manner as to sandwich pixels.

Figure 7B:
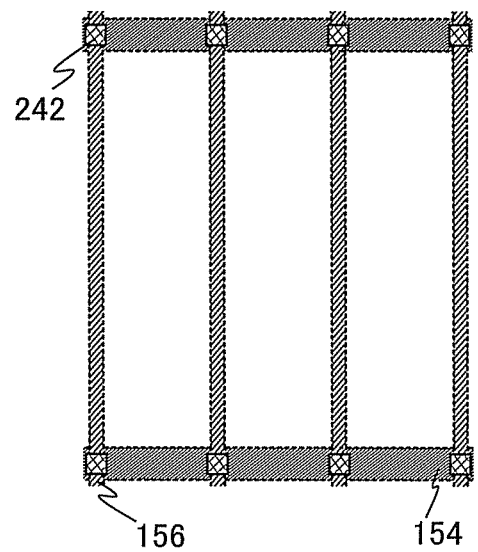

In the light-emitting device shown in FIG. 7B, the structure bodies 242 are formed in regions where the plurality of source wirings 156 intersects with the plurality of gate wirings 154. That is, the structure bodies 242 are arranged in four corners of each pixel. Note that the structure body 242 has a quadrangular shape in the top view; however, the shape is not limited thereto. For example, the structure body 242 can have various shapes such as a polygonal shape, a circular shape, an elliptical shape, an L-shape, and a cross-shape. Specifically, the structure bodies 242 with an L-shape and a cross-shape are preferably provided in regions where the plurality of source wirings 156 intersects with the plurality of gate wirings 154 because the area of each of the structure bodies can be increased, and the contact area with a layer (the second electrode layer or the first bonding layer) being in contact with the structure bodies is increased, so that adhesion is improved.

Figure 7C:
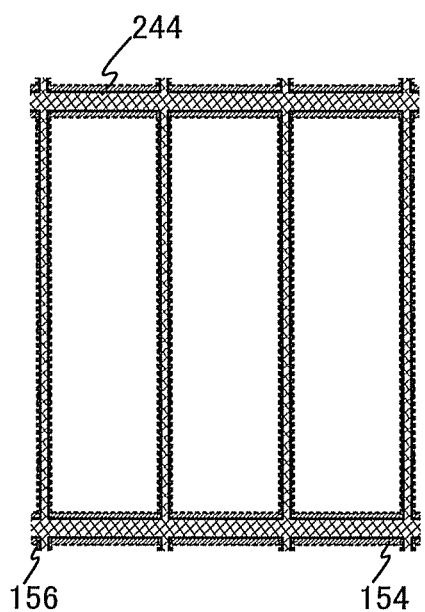

In the light-emitting device shown in FIG. 7C, structure bodies 244 are formed to substantially overlap with the plurality of source wirings 156 and the plurality of gate wirings 154. That is, the structure bodies 244 are provided so as to surround each pixel.

Further, in the case where the structure bodies 244 are formed of a material which does not have a light-transmitting property, the structure as shown in FIG. 7C is preferable because light-emission from a light-emitting element can be obtained independently in each pixel and light leakage to an adjacent pixel can be prevented.

Figure 7D:
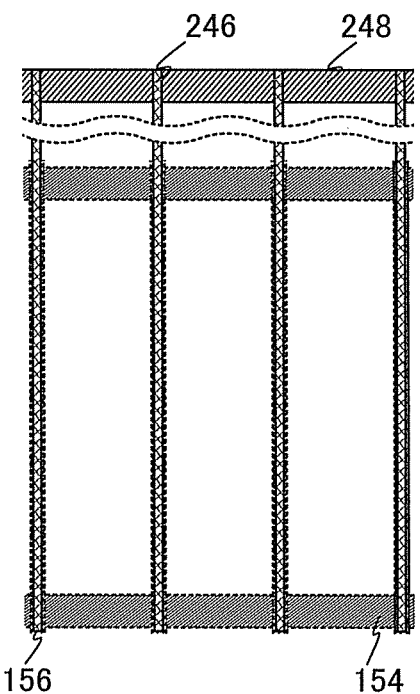

The light-emitting device shown in FIG. 7D is a modified example of the light-emitting device shown in FIG. 7A. Structure bodies 246 are formed to substantially overlap with the plurality of source wirings 156. That is, the structure bodies 246 are arranged in stripes Note that the structure bodies 246 are formed of a conductive metal material, and the second electrode layer 122 is electrically connected to a cathode common line layer 248 which is separately formed through the structure body 246. By using the structure body 246 as an auxiliary electrode in this manner, luminance gradient between pixels can be reduced.

As described above, this embodiment can provide a highly reliable light-emitting device in which a light-emitting element is prevented from being damaged when external, physical force is applied by providing structure bodies between pixels, Embodiment 3 can be implemented in appropriate combination with the structures described in the other embodiments.

Embodiment 4

In this embodiment, details of the light-emitting element 130 including the first electrode layer 118, the light-emitting layer 120, and the second electrode layer 122 which are described in Embodiment 1 will be described with reference to FIGS. 8A and 8B.

⟨Structure of Light-Emitting Element⟩

Figure 8A:
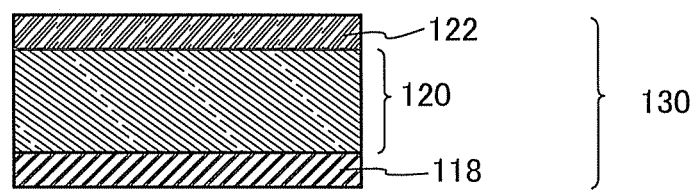
FIGS. 8A and 8B are cross-sectional views illustrating a light-emitting element.

The light-emitting element 130 shown in FIG. 8A has a structure in which the light-emitting layer 120 including a light-emitting region is sandwiched between a pair of electrodes (the first electrode layer 118 and the second electrode layer 122). Note that the first electrode layer 118 is used as an anode and the second electrode 122 is used as a cathode as an example in the following description of this embodiment.

The light-emitting layer 120 only needs to include at least a light-emitting layer, and may also have a stacked structure including a functional layer in addition to the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

The light-emitting element 130 shown in FIG. 8A emits light when current flows because of a potential difference generated between the first electrode layer 118 and the second electrode layer 122, and holes and electrons are recombined in the light-emitting layer 120. That is, a light-emitting region is formed in the light-emitting layer 120.

In this invention, light emission from the light-emitting element 130 is extracted to the outside from the first electrode layer 118 or the second electrode layer 122 side. Accordingly, one or both of the first electrode layer 118 or the second electrode layer 122 is/are formed using a substance having a light-transmitting property.

Figure 8B:
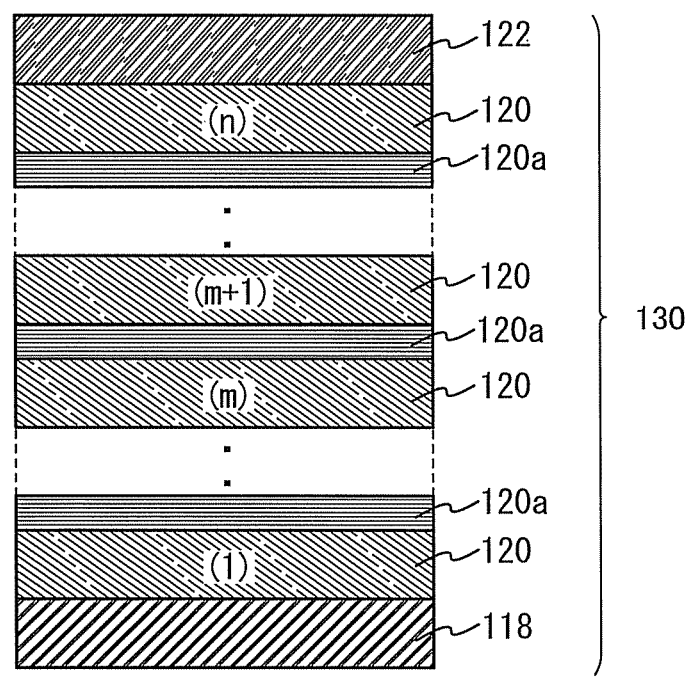

Note that a plurality of light-emitting layers 120 may be stacked between the first electrode layer 118 and the second electrode layer 122 as shown in FIG. 8B. In the case where n (n is a natural number of 2 or more) layers are stacked, a charge generation layer 120a is preferably provided between each m-th (m is a natural number of 1 to n−1) light-emitting layer and each (m+1)-th light-emitting layer.

The charge generation layer 120a may be formed of a composite material of an organic compound and a metal oxide, a metal oxide, or a composite material of an organic compound and an alkaline metal, an alkaline earth metal, or a compound thereof; alternatively, these materials may be combined as appropriate. The composite material of an organic compound and a metal oxide includes an organic compound and a metal oxide such as vanadium oxide, molybdenum oxide, or tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transport property and has a hole mobility of $10^{-6}$ cm$^2$/Vs or higher. However, any substance other than the above substances may also be used as long as it is a substance in which the hole-transport property is higher than the electron-transport property. These materials used for the charge generation layer 120a are excellent in carrier-injection property and carrier-transport property, and thus the light-emitting element 130 can be driven with low current and with low voltage.

It is to be noted that the charge generation layer 120a may be formed with a combination of a composite material of an organic compound and a metal oxide and another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

As for the light-emitting element 130 having such a structure, problems such as energy transfer, quenching, and the like are unlikely to occur, and a light-emitting element which has both high light emission efficiency and long lifetime is easily obtained due to expansion in the choice of materials. Further, a light-emitting element which provides phosphorescence from one of light-emitting layers and fluorescence from the other of the light-emitting layers can be easily obtained.

Note that the charge generation layer 120a has a function of injecting holes to one of the light-emitting layers 120, which is formed in contact with the charge generation layer 120a, and a function of injecting electrons to the other of the light-emitting layers 120, when a voltage is applied between the first electrode layer 118 and the second electrode layer 122.

The light-emitting element 130 shown in FIG. 8B can provide a variety of emission colors by changing the type of the light-emitting substance which is used for the light-emitting layer 120. In addition, a plurality of light-emitting substances of different colors is used as the light-emitting substance, whereby light emission having a broad spectrum or white light emission can also be obtained.

In the case of obtaining white light emission using the light-emitting element 130 shown in FIG. 8B, as for a combination of a plurality of light-emitting layers, a structure for emitting white light including red light, blue light, and green light may be used. For example, the structure may include a first light-emitting layer containing a blue fluorescent substance as a light-emitting substance and a second light-emitting layer containing green and red phosphorescent substances as light-emitting substances. Alternatively, the structure may include a first light-emitting layer emitting red light, a second light-emitting layer emitting green light, and a third light-emitting layer emitting blue light. Also with a structure including light-emitting layers emitting light of complementary colors, white light emission can be obtained. When light emission from the first light-emitting layer and light emission from the second light-emitting layer have complementary colors to each other in a stacked element including two light-emitting layers, the combination of colors are as follows: blue and yellow, blue-green and red, and the like.

Note that in the structure of the above-mentioned stacked element, by providing the charge generation layer between the stacked light-emitting layers, the element can have long lifetime in a high-luminance region while keeping the current density low. In addition, the voltage drop due to resistance of the electrode material can be reduced, whereby uniform light emission in a large area is possible.

Embodiment 4 can be implemented in appropriate combination with the structures described in the other embodiments.

Embodiment 5

Figure 9A:
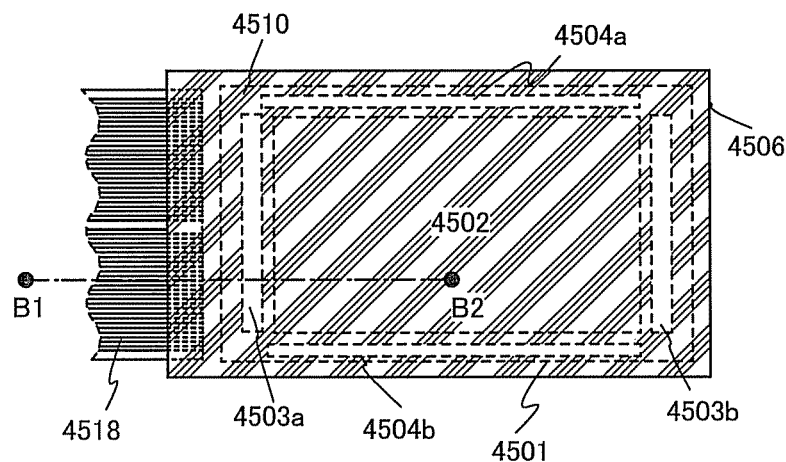
FIGS. 9A and 9B are a top view and a cross-sectional view of a light-emitting device.
Figure 9B:
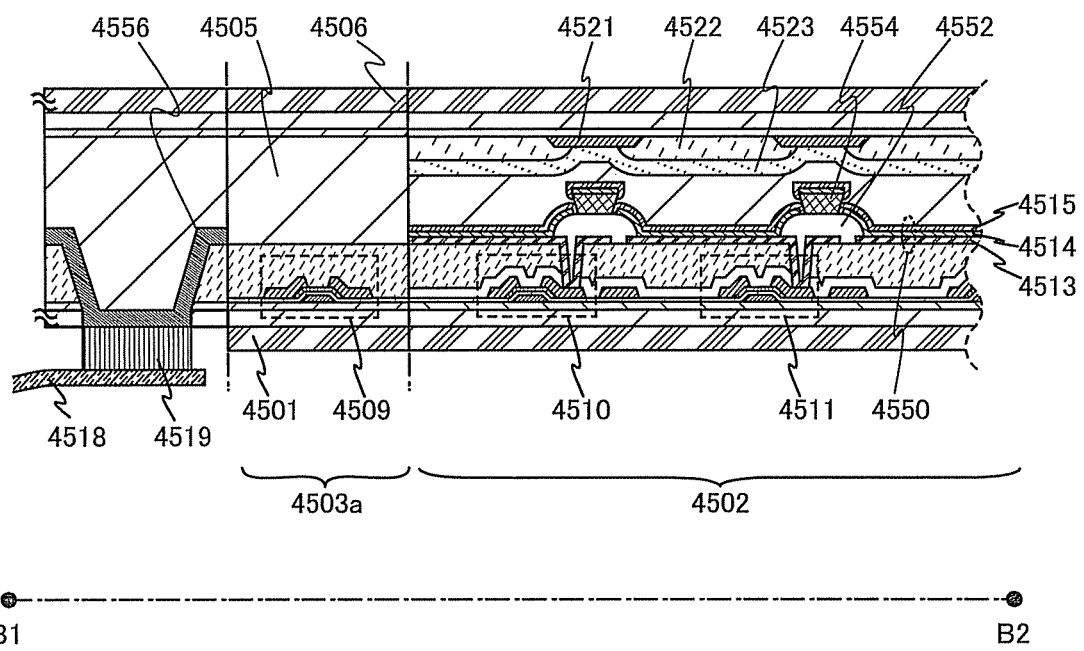

In this embodiment, an appearance and a cross section of a display device (also referred to as a display panel or a light-emitting panel) which is one embodiment of a light-emitting device will be described with reference to FIGS. 9A and 9B. FIG. 9A is a top view of a panel in which a transistor for driving a light-emitting element and a light-emitting element provided over a first substrate, and a light shielding film, a color filter, and an overcoat provided over a second substrate, are sealed. FIG. 9B corresponds to a cross-sectional view taken along broken line B1-B2 in FIG. 9A.

The light-emitting device shown in FIG. 9A is provided with a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b.

In this embodiment, the first substrate 4501 and the second substrate 4506 are formed using flexible substrates by a method of separation and transposition described in Embodiment 1.

Further, in the light-emitting device shown in FIG. 9B, transistors 4509, 4510, and 4511 are formed over the first substrate 4501, and a light-emitting element 4550 is formed over the transistors 4510 and 4511.

Light from the light-emitting element 4550 is emitted from the second substrate 4506 side. That is, the light-emitting device is a top emission type light-emitting device. Thus, the second substrate 4506 needs to have a light-transmitting property. For example, a material such as a glass plate, a plastic plate, a polyester film, an acrylic film, or the like is used for the second substrate 4506.

The light shielding film 4521, the color filter 4522, and the overcoat 4523 are provided over the second substrate 4506. The light shielding film 4521, the color filter 4522, and the overcoat 4523 can be formed by a method similar to the method described in Embodiment 1 in which the light shielding film, the color filter, and the overcoat are formed over the second substrate 160.

Further, the pixel portion 4502, the signal line driver circuits 4503a and 4503b, and the scan line driver circuits 4504a and 4504b are sealed by the first substrate 4501, the first bonding layer 4505, and the second substrate 4506. It preferable that a panel be packaged (sealed) with a protective film (an attachment film, an ultraviolet curable resin film, or the like) or a cover material with little degasification so that the panel is not exposed to the outside air, in which case the air-tightness becomes high.

Further, the pixel portion 4502, the signal line driver circuits 4503a and 4503b, the scan line driver circuits 4504a and 4504b which are provided over the first substrate 4501 each include a plurality of transistors, and transistors 4510 and 4511 included in the pixel portion 4502 and a transistors 4509 included in the signal line driver circuit 4503a are shown in FIG. 9B.

The transistor 4509 to the transistor 4511 can be formed by a method similar to that for the transistor 150 described in Embodiment 1. In addition, in the pixel portion 4502, the light-emitting element 4550 is formed over the transistors 4510 and 4511.

The light-emitting element 4550 includes the first electrode layer 4513, the light-emitting layer 4514, and the second electrode layer 4515, and is electrically connected to the transistor 4510 or the transistor 4511. Further, the light-emitting element 4550 can have an element structure described in Embodiment 4.

The light-emitting element 4550 is separated by partition walls 4552 and structure bodies 4554.

The partition wall 4552 is formed using an organic resin film, an inorganic insulating film, or organic polysiloxane. It is, particularly preferable that the partition wall 4552 be formed using a photosensitive material and a sidewall of the partition wall 4552 be formed to have an inclined surface with continuous curvature.

The structure body 4554 is provided so as to separate the light-emitting layer 4514 between pixels. In this embodiment, the separation of the second electrode layer 4515 is also illustrated together with the separation of the light-emitting layer 4514; however, the second electrode layer 4515 is not necessarily separated. The structure body 4554 is at least partly in contact with the second electrode layer 4515 or the first bonding layer 4505.

The structure body 4554 has a region which is in contact with the second electrode layer 4515 or the first bonding layer 4505 without interposing the light-emitting layer 4514 therebetween. The region of the structure body 4554, which is in contact with the second electrode layer 4515 or the first bonding layer 4505 without interposing the light-emitting layer 4514 therebetween, can have high adhesion. By providing the structure body 4554 between the pixels, the light-emitting element 4550 is protected. Accordingly, with the region having improved adhesion provided in the structure body 4554, the light-emitting element 4550 can be prevented from being damaged when external physical force is applied.

In addition, a variety of signals and potentials are supplied from an FPC 4518 to the signal line driver circuit 4503a, the signal line driver circuit 4503b, the scan line driver circuit 4504a, the scan line driver circuit 4504b, or the pixel portion 4502.

In this embodiment, a structure in which an FPC 4518 is mounted on the first substrate 4501 side is illustrated. The first substrate 4501 and the second substrate 4506 are formed using flexible substrates. It is difficult to expose a connection terminal of the FPC 4518 to the second substrate 4506 side since the light-emitting device is formed to be flexible by the method of separation and transposition described in Embodiment 1. Thus, a through electrode 4556 is formed in a region to which the FPC 4518 is connected, so that a method of connecting the FPC 4518 from the first substrate 4501 side is preferable. Note that the method of connecting the FPC 4518 is not limited thereto, and the FPC 4518 may be connected from the second substrate 4506 side.

The through electrode 4556 is electrically connected to a terminal included in the FPC 4518 through an anisotropic conductive film 4519.

If necessary, an optical film such as a polarizing plate, a circularly polarizing plate (including an elliptically polarizing plate), a retardation plate (a quarter-wave plate or a half-wave plate), or the like may be appropriately provided for the second substrate 4506. Further, the polarizing plate or the circularly polarizing plate may be provided with an anti-reflection film. For example, anti-glare treatment by which reflected light can be diffused by projections and depressions on the surface so as to reduce the glare can be performed.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. Alternatively, only the signal line driver circuits or a part thereof, or only the scan line driver circuits or a part thereof may be separately formed and then mounted. This embodiment is not limited to the structure shown in FIGS. 9A and 9B.

As described above, this embodiment can provide a highly reliable light-emitting device in which a light-emitting element is prevented from being damaged when external physical force is applied by providing structure bodies between pixels.

Embodiment 5 can be implemented in appropriate combination with the structures described in the other embodiments.

Embodiment 6

In this embodiment, a mobile phone incorporating the light-emitting device described in Embodiment 5 will be described with reference to FIGS. 10A and 10B.

Figure 10A:
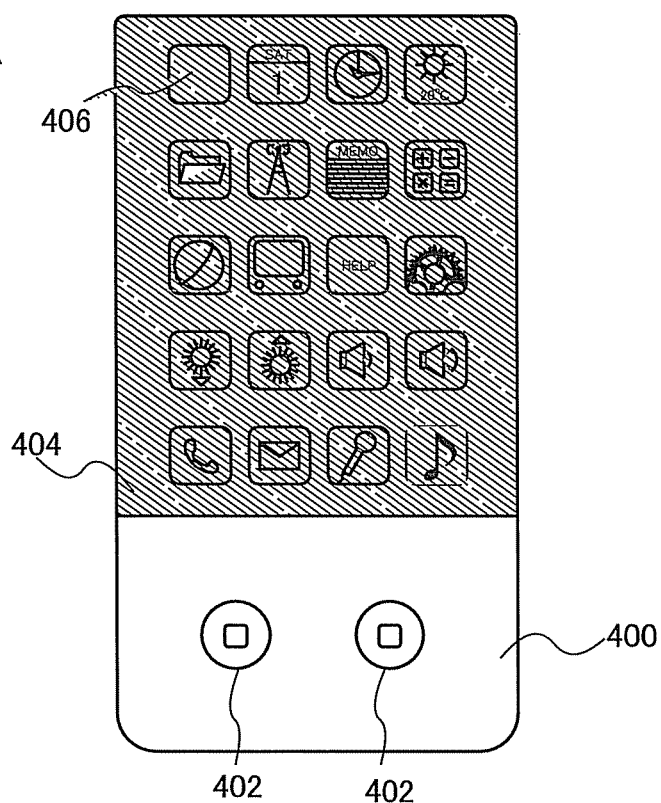
FIGS. 10A and 10B are a top view and a perspective view of a mobile phone using a light-emitting device.
Figure 10B:
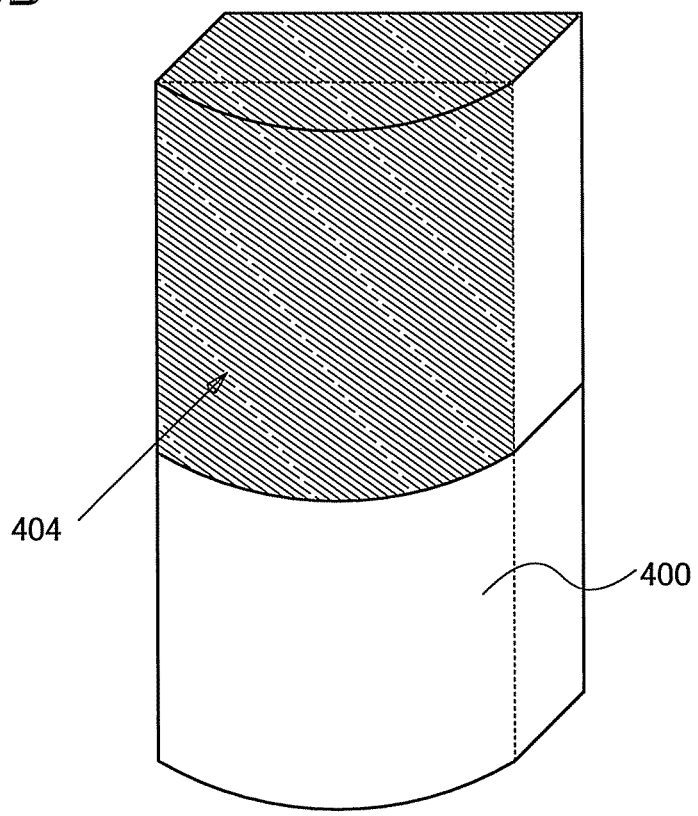

FIG. 10A is a top view of the mobile phone when it is seen from the front, and FIG. 10B is a perspective view of the mobile phone.

The mobile phone shown in FIGS. 10A and 10B has a housing 400, a display portion 404 incorporated into the housing 400, and operation buttons 402.

Further, the light-emitting device described in Embodiment 5 is incorporated into the display portion 404. In this embodiment, a combination of the light-emitting device and a touch panel which are separately formed is a display portion 404. Thus, operation portions 406 are formed over the display portion 404.

In the mobile phone of this embodiment, as shown in FIG. 10B, the display portion 404 is curved with a specific curvature radius. Further, the top portion of the housing 400 is also included in the display portion 404; thus, the display portion 404 of the mobile phone can be seen not only from the front but also from the top portion.

For example, on the display portion 404, incoming mails or calls, dates, phone numbers, personal names, and the like may be displayed. Accordingly, when the mobile phone is put in a breast pocket or the like, the display portion 404 can be seen without taking out the mobile phone from the breast pocket or the like.

The light-emitting device of this invention can be formed over a flexible substrate as described above and thus can be applied to a curved medium. Further, the light-emitting device formed over a flexible substrate is thin and lightweight; thus is preferably applied to a mobile phone and the like.

As described above, this embodiment can provide a highly reliable light-emitting device in which a light-emitting element is prevented from being damaged when external physical force is applied by providing structure bodies between pixels.

Embodiment 6 can be implemented in appropriate combination with the structures described in the other embodiments.

Embodiment 7

In this embodiment, electronic devices each including the light-emitting device described in any of Embodiments 1 to 5 will be described.

Examples of the electronic device including the light-emitting device described in Embodiments 1 to 5 include cameras such as video cameras, digital video cameras, or the like, goggle type displays, navigation systems, audio playback devices (e.g., car audio systems and audio systems), computers, game machines, portable information terminals (e.g., mobile computers, mobile phones, portable game machines, and electronic books), image playback devices in which a recording medium is provided (specifically, devices that are capable of playing back recording media such as digital versatile discs (DVDs) or the like and equipped with a display unit that can display images), and the like. Specific examples of these electronic devices are shown in FIGS. 11A to 11D.

Figure 11A:
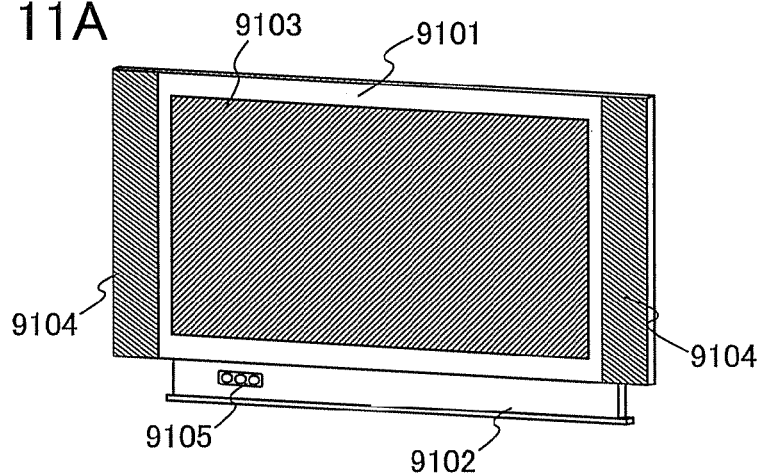
FIGS. 11A and 11D are electronic devices using a lighting-emitting device.

FIG. 11A illustrates a television device, which includes a chassis 9101, a support 9102, a display portion 9103, speaker portions 9104, a video input terminal 9105, and the like. The television device can be manufactured using the light-emitting device described in any of Embodiments 1 to 5 in the display portion 9103. By using the light-emitting device of the invention in the display portion 9103, a television device having a reliable display portion can be provided.

Figure 11B:
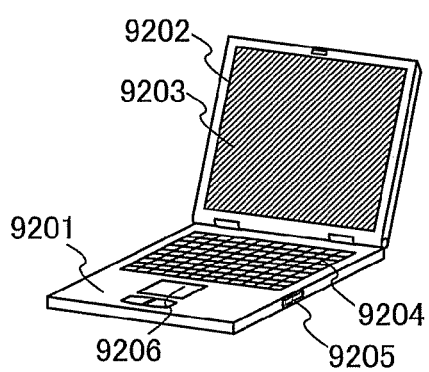

FIG. 11B illustrates a computer, which includes a main body 9201, a chassis 9202, a display portion 9203, a keyboard 9204, an external connection port 9205, a pointing device 9206, and the like. The computer can be manufactured using the light-emitting device described in any of Embodiments 1 to 5 in the display portion 9203. By using the light-emitting device of the invention in the display portion 9203, a computer having a reliable display portion can be provided.

Figure 11C:
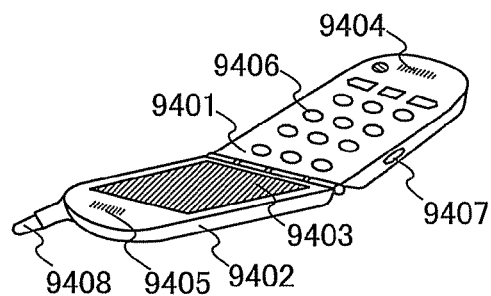

FIG. 11C illustrates a mobile phone, which includes a main body 9401, a housing 9402, a display portion 9403, an audio input portion 9404, an audio output portion 9405, an operation key 9406, an external connection port 9407, an antenna 9408, and the like. The mobile phone can be manufactured using the light-emitting device described in any of Embodiments 1 to 5 in the display portion 9403. By using the light-emitting device of the invention in the display portion 9403, a mobile phone having a reliable display portion can be provided.

Figure 11D:
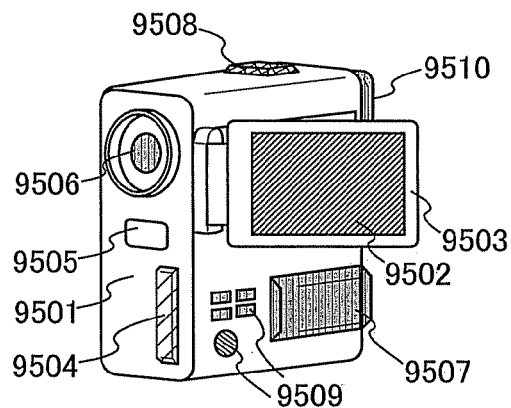

FIG. 11D illustrates a digital video camera, which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. The digital video camera can be manufactured using the light-emitting device described in any of Embodiments 1 to 5 in the display portion 9502. By using the light-emitting device of the invention in the display portion 9502, a digital video camera having a reliable display portion can be provided.

As described above, the application range of the light-emitting device described in any of Embodiments 1 to 5 is so wide that the light-emitting device can be applied to electronic devices of various fields.

Embodiment 7 can be implemented in appropriate combination with the structures described in the other embodiments.

EXPLANATION OF REFERENCE

100: substrate, 101: separation layer, 102: bonding layer, 104: buffer layer, 106: gate electrode layer, 108: gate insulating layer, 110: semiconductor layer, 112*a*: source electrode layer, 112*b*: drain electrode layer, 114: insulating layer, 116: insulating layer, 118: electrode layer, 120: light-emitting layer, 120*a*: charge generation layer, 122: electrode layer, 124: partition wall, 126: structure body, 130: light-emitting element, 150: transistor, 152: transistor, 154: gate wiring, 156: source wiring, 160: substrate, 161: separation layer, 162: buffer layer, 163: bonding layer, 164: light shielding film, 166: color filter, 168: overcoat, 170: bonding layer, 180: substrate, 190: substrate, 202: structure body, 204: structure body, 206: structure body, 208: structure body, 210: structure body, 212: partition wall, 214: structure body, 240: structure body, 242: structure body, 244: structure body, 246: structure body, 248: cathode line layer, 400: housing, 402: operation button, 404: display portion, 406: operation portion, 4501: substrate, 4502: pixel portion, 4503*a*: signal line driver circuit, 4503*b*: signal line driver circuit, 4504*a*: scan line driver circuit, 4504*b*: scan line driver circuit, 4505: bonding layer, 4506: substrate, 4509: transistor, 4510: transistor, 4511: transistor, 4513: electrode layer, 4514: light-emitting layer, 4515: electrode layer, 4518: FPC, 4519: anisotropic conductive film, 4521: light shielding film, 4522: color filter, 4523: overcoat, 4550: light-emitting element, 4552: partition wall, 4554: structure body, 4556: through electrode, 9101: chassis, 9102: support, 9103: display portion, 9104: speaker portion, 9105: video input terminal, 9201: main body, 9202: a chassis, 9203: display portion, 9204: keyboard, 9205: external connection port, 9206: pointing device, 9401: main body, 9402: housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote control receiving portion, 9506: image receiving portion, 9507: battery, 9508: audio input portion, 9509: operation keys, 9510: eyepiece portion This application is based on Japanese Patent Application serial no. 2011-039621 filed with Japan Patent Office on Feb. 25, 2011, the entire contents of which are hereby incorporated by reference.

The invention claimed is:

1. A light emitting device comprising:
a first pixel electrode layer over a first substrate;
a structure body over the first pixel electrode layer;
a first light-emitting layer over the first pixel electrode layer;
a second light-emitting layer over the structure body;
a second electrode layer over the first light-emitting layer;
a third electrode layer over the second light-emitting layer;
a bonding layer over the second electrode layer and the third electrode layer; and
a second substrate over the bonding layer,
wherein the first pixel electrode is electrically connected to a pixel transistor,
wherein the structure body comprises an organic insulating material,
wherein a side portion of the structure body protrudes from a bottom of the structure body in a direction parallel to the first substrate,
wherein the first light-emitting layer is separated from the second light-emitting layer by the structure body,
wherein the second electrode layer is separated from the third electrode layer by the structure body,
wherein at least a part of the structure body is in contact with the second electrode layer and the third electrode layer, and
wherein at least a part of the structure body is in contact with the bonding layer.

2. The light-emitting device according to claim 1, wherein the first substrate and the second substrate have flexibility.

3. The light-emitting device according to claim 1, wherein the first pixel electrode layer is electrically connected to a transistor.

4. The light-emitting device according to claim 1, wherein the second substrate has a colored layer which is capable of transmitting light of a specific wavelength band.

5. The light-emitting device according to claim 1, wherein each of the first light-emitting layer and the second light-emitting layer includes a hole injection layer, a hole transport layer, an electron transport layer, and an electron injection layer.

6. The light-emitting device according to claim 1, wherein the first light-emitting layer is capable of emitting white light.

7. The light-emitting device according to claim 1, wherein the second electrode layer is electrically connected to a common electrode layer.

8. An electronic device using the light-emitting device described in claim 1.

9. A light emitting device comprising:
a first pixel electrode layer over a first substrate;
a structure body over the first pixel electrode layer;
a first light-emitting layer over the first pixel electrode layer;
a second light-emitting layer over the structure body;
a second electrode layer over the first light-emitting layer;
a third electrode layer over the second light-emitting layer;
a bonding layer over the second electrode layer and the third electrode layer; and
a second substrate over the bonding layer,
wherein the first pixel electrode is electrically connected to a pixel transistor,
wherein the structure body comprises an organic insulating material,
wherein a side portion of the structure body protrudes from a bottom of the structure body in a direction parallel to the first substrate, wherein the first light-emitting layer is separated from the second light-emitting layer by the structure body, wherein the second electrode layer is separated from the third electrode layer by the structure body, and wherein at least a part of the structure body is in contact with the second electrode layer and the third electrode layer.

10. The light-emitting device according to claim 9, wherein the first substrate and the second substrate have flexibility.

11. The light-emitting device according to claim 9, wherein the first pixel electrode layer is electrically connected to a transistor.

12. The light-emitting device according to claim 9, wherein the second substrate has a colored layer which is capable of transmitting light of a specific wavelength band.

13. The light-emitting device according to claim 9, wherein each of the first light-emitting layer and the second light-emitting layer includes a hole injection layer, a hole transport layer, an electron transport layer, and an electron injection layer.

14. The light-emitting device according to claim 9, wherein the first light-emitting layer is capable of emitting white light.

15. The light-emitting device according to claim 9, wherein the second electrode layer electrically is connected to a common electrode layer.

16. An electronic device using the light-emitting device described in claim 9.

17. A light emitting device comprising:
a first pixel electrode layer over a first substrate;
a partition wall over the first pixel electrode layer;
a structure body over the partition wall;
a first light-emitting layer over the first pixel electrode layer, and the partition wall;
a second light-emitting layer over the structure body;
a second electrode layer over the first light-emitting layer;
a third electrode layer over the second light-emitting layer;
a bonding layer over the second electrode layer and the third electrode layer; and
a second substrate over the bonding layer, wherein the first pixel electrode is electrically connected to a pixel transistor, wherein the structure body comprises an organic insulating material, wherein a side portion of the structure body protrudes from a bottom of the structure body in a direction parallel to the first substrate, wherein the first light-emitting layer is separated from the second light-emitting layer by the structure body, wherein the second electrode layer is separated from the third electrode layer by the structure body, wherein at least a part of the structure body is in contact with the second electrode layer and the third electrode layer, and wherein at least a part of the structure body is in contact with the bonding layer.

18. The light-emitting device according to claim 17, wherein the first substrate and the second substrate have flexibility.

19. The light-emitting device according to claim 17, wherein the first pixel electrode layer is electrically connected to a transistor.

20. The light-emitting device according to claim 17, wherein the second substrate has a colored layer which is capable of transmitting light of a specific wavelength band.

21. The light-emitting device according to claim 17, wherein each of the first light-emitting layer and the second light-emitting layer includes a hole injection layer, a hole transport layer, an electron transport layer, and an electron injection layer.

22. The light-emitting device according to claim 17, wherein the first light-emitting layer is capable of emitting white light.

23. The light-emitting device according to claim 17, wherein the second electrode layer are electrically connected to a common electrode layer.

24. An electronic device using the light-emitting device described in claim 17.

25. The light-emitting device according to claim 17, wherein the partition wall is made of an organic insulating material.

* * * * *